United States Patent
Steiner et al.

(10) Patent No.: US 9,397,706 B1
(45) Date of Patent: *Jul. 19, 2016

(54) SYSTEM AND METHOD FOR IRREGULAR MULTIPLE DIMENSION DECODING AND ENCODING

(71) Applicant: DENSBITS TECHNOLOGIES LTD., Haifa (IL)

(72) Inventors: Avi Steiner, Kiryat Motzkin (IL); Hanan Weingarten, Herzelia (IL)

(73) Assignee: AVAGO TECHNOLOGIES GENERAL IP (SINGAPORE) PTE. LTD., Yishun (SG)

( * ) Notice: Subject to any disclaimer, the term of this patent is extended or adjusted under 35 U.S.C. 154(b) by 0 days.

This patent is subject to a terminal disclaimer.

(21) Appl. No.: 14/049,547

(22) Filed: Oct. 9, 2013

(51) Int. Cl.
*H03M 13/29* (2006.01)
*H03M 13/11* (2006.01)

(52) U.S. Cl.
CPC ...... *H03M 13/2918* (2013.01); *H03M 13/1105* (2013.01)

(58) Field of Classification Search
CPC  H03M 13/35; H03M 13/345; H03M 13/2918
See application file for complete search history.

(56) References Cited

U.S. PATENT DOCUMENTS

| | | |
|---|---|---|
| 4,430,701 A | 2/1984 | Christian et al. |
| 4,463,375 A | 7/1984 | Macovski |
| 4,584,686 A | 4/1986 | Fritze |
| 4,589,084 A | 5/1986 | Fling et al. |
| 4,777,589 A | 10/1988 | Boettner et al. |
| 4,866,716 A | 9/1989 | Weng |
| 5,003,597 A | 3/1991 | Merkle |
| 5,077,737 A | 12/1991 | Leger et al. |
| 5,297,153 A | 3/1994 | Baggen et al. |
| 5,305,276 A | 4/1994 | Uenoyama |
| 5,592,641 A | 1/1997 | Doyle et al. |
| 5,623,620 A | 4/1997 | Alexis et al. |
| 5,640,529 A | 6/1997 | Hasbun |
| 5,657,332 A | 8/1997 | Auclair et al. |
| 5,663,901 A | 9/1997 | Harari et al. |
| 5,724,538 A | 3/1998 | Morris et al. |
| 5,729,490 A | 3/1998 | Calligaro et al. |
| 5,740,395 A | 4/1998 | Wells et al. |
| 5,745,418 A | 4/1998 | Hu et al. |
| 5,778,430 A | 7/1998 | Ish et al. |
| 5,793,774 A | 8/1998 | Usui et al. |
| 5,920,578 A | 7/1999 | Zook et al. |

(Continued)

OTHER PUBLICATIONS

Search Report of PCT Patent Application WO 2009/118720 A3, Mar. 4, 2010.

(Continued)

*Primary Examiner* — Steve Nguyen
(74) *Attorney, Agent, or Firm* — Reches Patents

(57) ABSTRACT

A method for non-uniform multiple dimensional decoding, the method may include receiving or generating a multiple dimensional encoded data unit; and decoding by a processor the multiple dimensional encoded data unit to provide a decoded data unit; wherein the multiple dimensional encoded data unit comprises multiple component codes associated with multiple dimensions; wherein the multiple dimensions comprise a plurality of non-uniform dimensions; wherein at least two component codes of each non-uniform dimension differ from each other by encoding rate; wherein the decoding is responsive to encoding rates of component codes of the plurality of non-uniform dimensions.

45 Claims, 14 Drawing Sheets

(56) References Cited

U.S. PATENT DOCUMENTS

| | | |
|---|---|---|
| 5,926,409 A | 7/1999 | Engh et al. |
| 5,933,368 A | 8/1999 | Hu et al. |
| 5,956,268 A | 9/1999 | Lee |
| 5,956,473 A | 9/1999 | Hu et al. |
| 5,968,198 A | 10/1999 | Balachandran |
| 5,982,659 A | 11/1999 | Irrinki et al. |
| 6,011,741 A | 1/2000 | Harari et al. |
| 6,016,275 A | 1/2000 | Han |
| 6,038,634 A | 3/2000 | Ji et al. |
| 6,081,878 A | 6/2000 | Estakhri et al. |
| 6,094,465 A | 7/2000 | Stein et al. |
| 6,119,245 A | 9/2000 | Hiratsuka |
| 6,182,261 B1 | 1/2001 | Haller et al. |
| 6,192,497 B1 | 2/2001 | Yang et al. |
| 6,195,287 B1 | 2/2001 | Hirano |
| 6,199,188 B1 | 3/2001 | Shen et al. |
| 6,209,114 B1 | 3/2001 | Wolf et al. |
| 6,259,627 B1 | 7/2001 | Wong |
| 6,272,052 B1 | 8/2001 | Miyauchi |
| 6,278,633 B1 | 8/2001 | Wong et al. |
| 6,279,133 B1 | 8/2001 | Vafai et al. |
| 6,301,151 B1 | 10/2001 | Engh et al. |
| 6,370,061 B1 | 4/2002 | Yachareni et al. |
| 6,374,383 B1 | 4/2002 | Weng |
| 6,504,891 B1 | 1/2003 | Chevallier |
| 6,532,169 B1 | 3/2003 | Mann et al. |
| 6,532,556 B1 | 3/2003 | Wong et al. |
| 6,553,533 B2 | 4/2003 | Demura et al. |
| 6,560,747 B1 | 5/2003 | Weng |
| 6,637,002 B1 | 10/2003 | Weng et al. |
| 6,639,865 B2 | 10/2003 | Kwon |
| 6,674,665 B1 | 1/2004 | Mann et al. |
| 6,675,281 B1 | 1/2004 | Oh et al. |
| 6,704,902 B1 | 3/2004 | Shinbashi et al. |
| 6,751,766 B2 | 6/2004 | Guterman et al. |
| 6,772,274 B1 | 8/2004 | Estakhri |
| 6,781,910 B2 | 8/2004 | Smith |
| 6,792,569 B2 | 9/2004 | Cox et al. |
| 6,873,543 B2 | 3/2005 | Smith et al. |
| 6,891,768 B2 | 5/2005 | Smith et al. |
| 6,914,809 B2 | 7/2005 | Hilton et al. |
| 6,915,477 B2 | 7/2005 | Gollamudi et al. |
| 6,952,365 B2 | 10/2005 | Gonzalez et al. |
| 6,961,890 B2 | 11/2005 | Smith |
| 6,968,421 B2 | 11/2005 | Conley |
| 6,990,012 B2 | 1/2006 | Smith et al. |
| 6,996,004 B1 | 2/2006 | Fastow et al. |
| 6,999,854 B2 | 2/2006 | Roth |
| 7,010,739 B1 | 3/2006 | Feng et al. |
| 7,012,835 B2 | 3/2006 | Gonzalez et al. |
| 7,038,950 B1 | 5/2006 | Hamilton et al. |
| 7,068,539 B2 | 6/2006 | Guterman et al. |
| 7,079,436 B2 | 7/2006 | Perner et al. |
| 7,149,950 B2 | 12/2006 | Spencer et al. |
| 7,177,977 B2 | 2/2007 | Chen et al. |
| 7,188,228 B1 | 3/2007 | Chang et al. |
| 7,191,379 B2 | 3/2007 | Adelmann et al. |
| 7,196,946 B2 | 3/2007 | Chen et al. |
| 7,203,874 B2 | 4/2007 | Roohparvar |
| 7,212,426 B2 | 5/2007 | Park et al |
| 7,290,203 B2 | 10/2007 | Emma et al. |
| 7,292,365 B2 | 11/2007 | Knox |
| 7,296,212 B1 * | 11/2007 | Hammons, Jr. ............... 714/781 |
| 7,301,928 B2 | 11/2007 | Nakabayashi et al. |
| 7,315,916 B2 | 1/2008 | Bennett et al. |
| 7,388,781 B2 | 6/2008 | Litsyn et al. |
| 7,395,404 B2 | 7/2008 | Gorobets et al. |
| 7,441,067 B2 | 10/2008 | Gorobets et al. |
| 7,443,729 B2 | 10/2008 | Li et al. |
| 7,450,425 B2 | 11/2008 | Aritome |
| 7,454,670 B2 | 11/2008 | Kim et al. |
| 7,466,575 B2 | 12/2008 | Shalvi et al. |
| 7,533,328 B2 | 5/2009 | Alrod et al. |
| 7,558,109 B2 | 7/2009 | Brandman et al. |
| 7,593,263 B2 | 9/2009 | Sokolov et al. |
| 7,610,433 B2 | 10/2009 | Randell et al. |
| 7,613,043 B2 | 11/2009 | Cornwell et al. |
| 7,619,922 B2 | 11/2009 | Li et al. |
| 7,697,326 B2 | 4/2010 | Sommer et al. |
| 7,706,182 B2 | 4/2010 | Shalvi et al. |
| 7,716,538 B2 | 5/2010 | Gonzalez et al. |
| 7,804,718 B2 | 9/2010 | Kim |
| 7,805,663 B2 | 9/2010 | Brandman et al. |
| 7,805,664 B1 | 9/2010 | Yang et al. |
| 7,831,896 B2 * | 11/2010 | Amram et al. ............... 714/804 |
| 7,844,877 B2 | 11/2010 | Litsyn et al. |
| 7,911,848 B2 | 3/2011 | Eun et al. |
| 7,961,797 B1 | 6/2011 | Yang et al. |
| 7,975,189 B2 * | 7/2011 | Kose ............................. 714/704 |
| 7,975,192 B2 | 7/2011 | Sommer et al. |
| 8,020,073 B2 | 9/2011 | Emma et al. |
| 8,108,590 B2 | 1/2012 | Chow et al. |
| 8,122,328 B2 | 2/2012 | Liu et al. |
| 8,159,881 B2 | 4/2012 | Yang |
| 8,190,961 B1 | 5/2012 | Yang et al. |
| 8,250,324 B2 | 8/2012 | Haas et al. |
| 8,300,823 B2 | 10/2012 | Bojinov et al. |
| 8,305,812 B2 | 11/2012 | Levy et al. |
| 8,312,341 B1 * | 11/2012 | Varnica et al. ............... 714/752 |
| 8,327,246 B2 | 12/2012 | Weingarten et al. |
| 8,407,560 B2 | 3/2013 | Ordentlich et al. |
| 8,417,893 B2 | 4/2013 | Khmelnitsky et al. |
| 2001/0034815 A1 | 10/2001 | Dugan et al. |
| 2002/0063774 A1 | 5/2002 | Hillis et al. |
| 2002/0085419 A1 | 7/2002 | Kwon et al. |
| 2002/0154769 A1 | 10/2002 | Petersen et al. |
| 2002/0156988 A1 | 10/2002 | Toyama et al. |
| 2002/0174156 A1 | 11/2002 | Birru et al. |
| 2003/0014582 A1 | 1/2003 | Nakanishi |
| 2003/0065876 A1 | 4/2003 | Lasser |
| 2003/0101404 A1 | 5/2003 | Zhao et al. |
| 2003/0105620 A1 | 6/2003 | Bowen |
| 2003/0177300 A1 | 9/2003 | Lee et al. |
| 2003/0192007 A1 | 10/2003 | Miller et al. |
| 2004/0015771 A1 | 1/2004 | Lasser et al. |
| 2004/0030971 A1 | 2/2004 | Tanaka et al. |
| 2004/0059768 A1 | 3/2004 | Denk et al. |
| 2004/0080985 A1 | 4/2004 | Chang et al. |
| 2004/0153722 A1 | 8/2004 | Lee |
| 2004/0153817 A1 | 8/2004 | Norman et al. |
| 2004/0181735 A1 | 9/2004 | Xin |
| 2004/0203591 A1 | 10/2004 | Lee |
| 2004/0210706 A1 | 10/2004 | In et al. |
| 2005/0013165 A1 | 1/2005 | Ban |
| 2005/0018482 A1 | 1/2005 | Cemea et al. |
| 2005/0083735 A1 | 4/2005 | Chen et al. |
| 2005/0117401 A1 | 6/2005 | Chen et al. |
| 2005/0120265 A1 | 6/2005 | Pline et al. |
| 2005/0128811 A1 | 6/2005 | Kato et al. |
| 2005/0138533 A1 | 6/2005 | Le-Bars et al. |
| 2005/0144213 A1 | 6/2005 | Simkins et al. |
| 2005/0144368 A1 | 6/2005 | Chung et al. |
| 2005/0169057 A1 | 8/2005 | Shibata et al. |
| 2005/0172179 A1 | 8/2005 | Brandenberger et al. |
| 2005/0213393 A1 | 9/2005 | Lasser |
| 2005/0243626 A1 | 11/2005 | Ronen |
| 2006/0059406 A1 | 3/2006 | Micheloni et al. |
| 2006/0059409 A1 | 3/2006 | Lee |
| 2006/0064537 A1 | 3/2006 | Oshima |
| 2006/0101193 A1 | 5/2006 | Murin |
| 2006/0190271 A1 * | 8/2006 | Kim et al. ...................... 705/1 |
| 2006/0195651 A1 | 8/2006 | Estakhri et al. |
| 2006/0203587 A1 | 9/2006 | Li et al. |
| 2006/0221692 A1 | 10/2006 | Chen |
| 2006/0248434 A1 | 11/2006 | Radke et al. |
| 2006/0268608 A1 | 11/2006 | Noguchi et al. |
| 2006/0282411 A1 | 12/2006 | Fagin et al. |
| 2006/0284244 A1 | 12/2006 | Forbes et al. |
| 2006/0294312 A1 | 12/2006 | Walmsley |
| 2007/0025157 A1 | 2/2007 | Wan et al. |
| 2007/0063180 A1 | 3/2007 | Asano et al. |
| 2007/0081388 A1 | 4/2007 | Joo |
| 2007/0098069 A1 | 5/2007 | Gordon |
| 2007/0103992 A1 | 5/2007 | Sakui et al. |

(56) References Cited

U.S. PATENT DOCUMENTS

| | | |
|---|---|---|
| 2007/0104004 A1 | 5/2007 | So et al. |
| 2007/0109858 A1 | 5/2007 | Conley et al. |
| 2007/0124652 A1 | 5/2007 | Litsyn et al. |
| 2007/0140006 A1 | 6/2007 | Chen et al. |
| 2007/0143561 A1 | 6/2007 | Gorobets |
| 2007/0150694 A1 | 6/2007 | Chang et al. |
| 2007/0168625 A1 | 7/2007 | Cornwell et al. |
| 2007/0171714 A1 | 7/2007 | Wu et al. |
| 2007/0171730 A1 | 7/2007 | Ramamoorthy et al. |
| 2007/0180346 A1 | 8/2007 | Murin |
| 2007/0223277 A1 | 9/2007 | Tanaka et al. |
| 2007/0226582 A1 | 9/2007 | Tang et al. |
| 2007/0226592 A1 | 9/2007 | Radke |
| 2007/0228449 A1 | 10/2007 | Takano et al. |
| 2007/0253249 A1 | 11/2007 | Kang et al. |
| 2007/0253250 A1 | 11/2007 | Shibata et al. |
| 2007/0263439 A1 | 11/2007 | Cornwell et al. |
| 2007/0266291 A1 | 11/2007 | Toda et al. |
| 2007/0266300 A1* | 11/2007 | Ito et al. .................. 714/770 |
| 2007/0271494 A1 | 11/2007 | Gorobets |
| 2007/0297226 A1 | 12/2007 | Mokhlesi |
| 2008/0010581 A1 | 1/2008 | Alrod et al. |
| 2008/0028014 A1 | 1/2008 | Hilt et al. |
| 2008/0049497 A1 | 2/2008 | Mo |
| 2008/0055125 A1* | 3/2008 | Cideciyan et al. ............ 341/94 |
| 2008/0055989 A1 | 3/2008 | Lee et al. |
| 2008/0082897 A1 | 4/2008 | Brandman et al. |
| 2008/0092026 A1 | 4/2008 | Brandman et al. |
| 2008/0104309 A1 | 5/2008 | Cheon et al. |
| 2008/0112238 A1 | 5/2008 | Kim et al. |
| 2008/0116509 A1 | 5/2008 | Harari et al. |
| 2008/0126686 A1 | 5/2008 | Sokolov et al. |
| 2008/0127104 A1 | 5/2008 | Li et al. |
| 2008/0128790 A1 | 6/2008 | Jung |
| 2008/0130341 A1 | 6/2008 | Shalvi et al. |
| 2008/0137413 A1 | 6/2008 | Kong et al. |
| 2008/0137414 A1 | 6/2008 | Park et al. |
| 2008/0141043 A1 | 6/2008 | Flynn et al. |
| 2008/0148115 A1 | 6/2008 | Sokolov et al. |
| 2008/0158958 A1 | 7/2008 | Shalvi et al. |
| 2008/0159059 A1 | 7/2008 | Moyer |
| 2008/0162079 A1 | 7/2008 | Astigarraga et al. |
| 2008/0168216 A1 | 7/2008 | Lee |
| 2008/0168320 A1 | 7/2008 | Cassuto et al. |
| 2008/0181001 A1 | 7/2008 | Shalvi |
| 2008/0198650 A1 | 8/2008 | Shalvi et al. |
| 2008/0198652 A1 | 8/2008 | Shalvi et al. |
| 2008/0201620 A1 | 8/2008 | Gollub |
| 2008/0209114 A1 | 8/2008 | Chow et al. |
| 2008/0219050 A1 | 9/2008 | Shalvi et al. |
| 2008/0225599 A1 | 9/2008 | Chae |
| 2008/0250195 A1 | 10/2008 | Chow et al. |
| 2008/0263262 A1 | 10/2008 | Sokolov et al. |
| 2008/0282106 A1 | 11/2008 | Shalvi et al. |
| 2008/0285351 A1 | 11/2008 | Shlick et al. |
| 2008/0301532 A1 | 12/2008 | Uchikawa et al. |
| 2009/0024905 A1 | 1/2009 | Shalvi et al. |
| 2009/0027961 A1 | 1/2009 | Park et al. |
| 2009/0043951 A1 | 2/2009 | Shalvi et al. |
| 2009/0046507 A1 | 2/2009 | Aritome |
| 2009/0072303 A9 | 3/2009 | Prall et al. |
| 2009/0091979 A1 | 4/2009 | Shalvi |
| 2009/0103358 A1 | 4/2009 | Sommer et al. |
| 2009/0106485 A1 | 4/2009 | Anholt |
| 2009/0113275 A1 | 4/2009 | Chen et al. |
| 2009/0125671 A1 | 5/2009 | Flynn et al. |
| 2009/0132755 A1 | 5/2009 | Radke |
| 2009/0144598 A1 | 6/2009 | Yoon et al. |
| 2009/0144600 A1 | 6/2009 | Perlmutter et al. |
| 2009/0150599 A1 | 6/2009 | Bennett |
| 2009/0150748 A1 | 6/2009 | Egner et al. |
| 2009/0157964 A1 | 6/2009 | Kasorla et al. |
| 2009/0158126 A1 | 6/2009 | Perlmutter et al. |
| 2009/0168524 A1 | 7/2009 | Golov et al. |
| 2009/0187803 A1 | 7/2009 | Anholt et al. |
| 2009/0199074 A1 | 8/2009 | Sommer |
| 2009/0213653 A1 | 8/2009 | Perlmutter et al. |
| 2009/0213654 A1 | 8/2009 | Perlmutter et al. |
| 2009/0228761 A1 | 9/2009 | Perlmutter et al. |
| 2009/0240872 A1 | 9/2009 | Perlmutter et al. |
| 2009/0282185 A1 | 11/2009 | Van Cauwenbergh |
| 2009/0282186 A1 | 11/2009 | Mokhlesi et al. |
| 2009/0287930 A1 | 11/2009 | Nagaraja |
| 2009/0300269 A1 | 12/2009 | Radke et al. |
| 2009/0323942 A1 | 12/2009 | Sharon et al. |
| 2010/0005270 A1 | 1/2010 | Jiang |
| 2010/0025811 A1 | 2/2010 | Bronner et al. |
| 2010/0030944 A1 | 2/2010 | Hinz |
| 2010/0058146 A1 | 3/2010 | Weingarten et al. |
| 2010/0064096 A1 | 3/2010 | Weingarten et al. |
| 2010/0088557 A1 | 4/2010 | Weingarten et al. |
| 2010/0091535 A1 | 4/2010 | Sommer et al. |
| 2010/0095186 A1 | 4/2010 | Weingarten |
| 2010/0110787 A1 | 5/2010 | Shalvi et al. |
| 2010/0115376 A1 | 5/2010 | Shalvi et al. |
| 2010/0122113 A1 | 5/2010 | Weingarten et al. |
| 2010/0124088 A1 | 5/2010 | Shalvi et al. |
| 2010/0131580 A1 | 5/2010 | Kanter et al. |
| 2010/0131806 A1 | 5/2010 | Weingarten et al. |
| 2010/0131809 A1 | 5/2010 | Katz |
| 2010/0131826 A1 | 5/2010 | Shalvi et al. |
| 2010/0131827 A1 | 5/2010 | Sokolov et al. |
| 2010/0131831 A1 | 5/2010 | Weingarten et al. |
| 2010/0146191 A1 | 6/2010 | Katz |
| 2010/0146192 A1 | 6/2010 | Weingarten et al. |
| 2010/0149881 A1 | 6/2010 | Lee et al. |
| 2010/0172179 A1 | 7/2010 | Gorobets et al. |
| 2010/0174853 A1 | 7/2010 | Lee et al. |
| 2010/0180073 A1 | 7/2010 | Weingarten et al. |
| 2010/0199149 A1 | 8/2010 | Weingarten et al. |
| 2010/0211724 A1 | 8/2010 | Weingarten |
| 2010/0211833 A1 | 8/2010 | Weingarten |
| 2010/0211856 A1 | 8/2010 | Weingarten |
| 2010/0241793 A1 | 9/2010 | Sugimoto et al. |
| 2010/0246265 A1 | 9/2010 | Moschiano et al. |
| 2010/0251066 A1 | 9/2010 | Radke |
| 2010/0253555 A1 | 10/2010 | Weingarten et al. |
| 2010/0257309 A1 | 10/2010 | Barsky et al. |
| 2010/0269008 A1 | 10/2010 | Leggette et al. |
| 2010/0293321 A1 | 11/2010 | Weingarten |
| 2010/0318724 A1 | 12/2010 | Yeh |
| 2011/0051521 A1 | 3/2011 | Levy et al. |
| 2011/0055461 A1 | 3/2011 | Steiner et al. |
| 2011/0093650 A1 | 4/2011 | Kwon et al. |
| 2011/0096612 A1 | 4/2011 | Steiner et al. |
| 2011/0099460 A1 | 4/2011 | Dusija et al. |
| 2011/0119562 A1 | 5/2011 | Steiner et al. |
| 2011/0153919 A1 | 6/2011 | Sabbag |
| 2011/0161775 A1 | 6/2011 | Weingarten |
| 2011/0194353 A1 | 8/2011 | Hwang et al. |
| 2011/0209028 A1 | 8/2011 | Post et al. |
| 2011/0214029 A1 | 9/2011 | Steiner et al. |
| 2011/0214039 A1* | 9/2011 | Steiner et al. ................ 714/797 |
| 2011/0246792 A1 | 10/2011 | Weingarten |
| 2011/0246852 A1 | 10/2011 | Sabbag |
| 2011/0252187 A1 | 10/2011 | Segal et al. |
| 2011/0252188 A1 | 10/2011 | Weingarten |
| 2011/0271043 A1 | 11/2011 | Segal et al. |
| 2011/0302428 A1 | 12/2011 | Weingarten |
| 2012/0001778 A1 | 1/2012 | Steiner et al. |
| 2012/0005554 A1 | 1/2012 | Steiner et al. |
| 2012/0005558 A1 | 1/2012 | Steiner et al. |
| 2012/0005560 A1 | 1/2012 | Steiner et al. |
| 2012/0008401 A1 | 1/2012 | Katz et al. |
| 2012/0008414 A1 | 1/2012 | Katz et al. |
| 2012/0017136 A1 | 1/2012 | Ordentlich et al. |
| 2012/0051144 A1 | 3/2012 | Weingarten et al. |
| 2012/0063227 A1 | 3/2012 | Weingarten et al. |
| 2012/0066441 A1 | 3/2012 | Weingarten |
| 2012/0110250 A1 | 5/2012 | Sabbag et al. |
| 2012/0124273 A1 | 5/2012 | Goss et al. |
| 2012/0246391 A1 | 9/2012 | Meir et al. |

(56) References Cited

U.S. PATENT DOCUMENTS

| | | | | |
|---|---|---|---|---|
| 2013/0132793 | A1* | 5/2013 | Ha et al. | 714/755 |
| 2013/0311847 | A1* | 11/2013 | Miyata et al. | 714/755 |
| 2014/0254709 | A1* | 9/2014 | Flowers | 375/285 |

OTHER PUBLICATIONS

Search Report of PCT Patent Application WO 2009/095902 A3, Mar. 4, 2010.
Search Report of PCT Patent Application WO 2009/078006 A3, Mar. 4, 2010.
Search Report of PCT Patent Application WO 2009/074979 A3, Mar. 4, 2010.
Search Report of PCT Patent Application WO 2009/074978 A3, Mar. 4, 2010.
Search Report of PCT Patent Application WO 2009/072105 A3, Mar. 4, 2010.
Search Report of PCT Patent Application WO 2009/072104 A3, Mar. 4, 2010.
Search Report of PCT Patent Application WO 2009/072103 A3, Mar. 4, 2010.
Search Report of PCT Patent Application WO 2009/072102 A3, Mar. 4, 2010.
Search Report of PCT Patent Application WO 2009/072101 A3, Mar. 4, 2010.
Search Report of PCT Patent Application WO 2009/072100 A3, Mar. 4, 2010.
Search Report of PCT Patent Application WO 2009/053963 A3, Mar. 4, 2010.
Search Report of PCT Patent Application WO 2009/053962 A3, Mar. 4, 2010.
Search Report of PCT Patent Application WO 2009/053961 A3, Mar. 4, 2010.
Search Report of PCT Patent Application WO 2009/037697 A3, Mar. 4, 2010.
Yani Chen, Keshab K. Parhi, "Small Area Parallel Chien Search Architectures for Long BCH Codes", IEEE Transactions on Very Large Scale Integration(VLSI) Systems, vol. 12, No. 5, May 2004.
Yuejian Wu, "Low Power Decoding of BCH Codes", Nortel Networks, Ottawa, Ont., Canada, in Circuits and systems, 2004. ISCAS '04. Proceeding of the 2004 International Symposium on Circuits and Systems, published May 23-26, 2004, vol. 2, pp. II-369-72 vol. 2.
Michael Purser, "Introduction to Error Correcting Codes", Artech House Inc., 1995.
Ron M. Roth, "Introduction to Coding Theory", Cambridge University Press, 2006.
Akash Kumar, Sergei Sawitzki, "High-Throughput and Low Power Architectures for Reed Solomon Decoder", (a.kumar at tue.nl, Eindhoven University of Technology and sergei.sawitzki at philips.com), Oct. 2005.
Todd K.Moon, "Error Correction Coding Mathematical Methods and Algorithms", A John Wiley & Sons, Inc., 2005.
Richard E. Blahut, "Algebraic Codes for Data Transmission", Cambridge University Press, 2003.
David Esseni, Bruno Ricco, "Trading-Off Programming Speed and Current Absorption in Flash Memories with the Ramped-Gate Programming Technique", IEEE Transactions on Electron Devices, vol. 47, No. 4, Apr. 2000.
Giovanni Campardo, Rino Micheloni, David Novosel, "VLSI-Design of Non-Volatile Memories", Springer Berlin Heidelberg New York, 2005.
John G. Proakis, "Digital Communications", 3rd ed., New York: McGraw-Hill, 1995.
J.M. Portal, H. Aziza, D. Nee, "EEPROM Memory: Threshold Voltage Built in Self Diagnosis", ITC International Test Conference, Paper 2.1, Feb. 2005.
J.M. Portal, H. Aziza, D. Nee, "EEPROM Diagnosis Based on Threshold Voltage Embedded Measurement", Journal of Electronic Testing: Theory and Applications 21, 33-42, 2005.
G. Tao, A. Scarpa, J. Dijkstra, W. Stidl, F. Kuper, "Data retention prediction for modern floating gate non-volatile memories", Microelectronics Reliability 40 (2000), 1561-1566.
T. Hirncno, N. Matsukawa, H. Hazama, K. Sakui, M. Oshikiri, K. Masuda, K. Kanda, Y. Itoh, J. Miyamoto, "A New Technique for Measuring Threshold Voltage Distribution in Flash EEPROM Devices", Proc. IEEE 1995 Int. Conference on Microelectronics Test Structures, vol. 8, Mar. 1995.
Boaz Eitan, Guy Cohen, Assaf Shappir, Eli Lusky, Amichai Givant, Meir Janai, Ilan Bloom, Yan Polansky, Oleg Dadashev, Avi Lavan, Ran Sahar, Eduardo Maayan, "4-bit per Cell NROM Reliability", Appears on the website of Saifun.com, 2005.
Paulo Cappelletti, Clara Golla, Piero Olivo, Enrico Zanoni, "Flash Memories", Kluwer Academic Publishers, 1999.
JEDEC Standard, "Stress-Test-Driven Qualification of Integrated Circuits", JEDEC Solid State Technology Association. JEDEC Standard No. 47F pp. 1-26, Dec. 2007.
Dempster, et al., "Maximum Likelihood from Incomplete Data via the EM Algorithm", Journal of the Royal Statistical Society. Series B (Methodological), vol. 39, No. 1 (1997), pp. 1-38.
Mielke, et al., "Flash EEPROM Threshold Instabilities due to Charge Trapping During Program/Erase Cycling", IEEE Transactions on Device and Materials Reliability, vol. 4, No. 3, Sep. 2004, pp. 335-344.
Daneshbeh, "Bit Serial Systolic Architectures for Multiplicative Inversion and Division over GF (2)", A thesis presented to the University of Waterloo, Ontario, Canada, 2005, pp. 1-118.
Chen, Formulas for the solutions of Quadratic Equations over GF (2), IEEE Trans. Inform. Theory, vol. IT-28, No. 5, Sep. 1982, pp. 792-794.
Berlekamp et al., "On the Solution of Algebraic Equations over Finite Fields", Inform. Cont. 10, Oct. 1967, pp. 553-564.

* cited by examiner

Receiving or generating a multiple dimensional encoded data unit. 310

Decoding by a processor the multiple dimensional encoded data unit to provide a decoded data unit. The multiple dimensional encoded data unit comprises multiple component codes associated with multiple dimensions. The multiple dimensions comprise a plurality of non-uniform dimensions. At least two component codes of each non-uniform dimension differ from each other by encoding rate. The decoding is responsive to encoding rates of component codes of the plurality of non-uniform dimensions. 320

Receiving or generating a data unit. 410

Encoding by a processor the data unit to provide multiple dimensional encoded data unit; wherein the multiple dimensional encoded data unit comprises multiple component codes associated with multiple dimensions; wherein the multiple dimensions comprise a plurality of non-uniform dimensions; wherein at least two component codes of each non-uniform dimension differ from each other by encoding rate. 420

Receiving or generating a multiple dimensional encoded data unit.
510

Performing, for each dimension of multiple dimensions associated with the multiple dimensional encoded data unit, multiple decoding attempts of component codes that belong to the dimension and differ from each other by decoding rate. 520

SYSTEM AND METHOD FOR IRREGULAR MULTIPLE DIMENSION DECODING AND ENCODING

CROSS REFERENCE TO RELATED APPLICATIONS

This application relates to a concurrently filed and co-pending U.S. patent application Ser. No. 14/049,758, entitled "System and Method for Irregular Multiple Dimension Decoding and Encoding" by Avi Steiner and Hanan Weingarten, owned by the assignee of this application and incorporated by reference herein in its entirety.

BACKGROUND

ECC—Error-Correction-Coding is a process by which additional redundant information is appended to a message in order to render the message resilient to errors inflicted on it in the process of transmission and reception or equivalently, during storage and retrieval. This additional information is called the "redundancy." There are many various ways and algorithms to derive the redundancy, the exact algorithm is not pertinent to this invention, it is enough to note, that the redundancy is computed by the encoder from all of the message's bits.

In the decoder a reverse process occurs, the erroneous message with the redundancy is received and inspected. The errors are identified and fixed (if possible), the redundancy is stripped from the message, and the recovered message is passed to the client.

In multi-dimensional encoding, a stream of data is passed through the set of multiple component encoders, which together encode the full payload into a single codeword. It is well known that BCH encoding may be done by using a shift register through which the systematic data is passed. Therefore, that data simply passes through the component encoders without being modified while the shift-register advances. When the systematic data of the code completely passed through the shift-register, the content of the shift register is the redundancy of the code and is appended to the data stream. This principle works for all component encoders in all dimensions.

SUMMARY

A method, a system, and a non-transitory computer readable medium are provided for multi-dimensional decoding. A method, a system, and a non-transitory computer readable medium are provided for multi-dimensional decoding. There may be provided any method, system, and/or non-transitory computer readable medium as claimed in any claim or in any combination of claims.

There may be provided a method for non-uniform multiple dimensional decoding, the method may include receiving or generating a multiple dimensional encoded data unit; and decoding by a processor the multiple dimensional encoded data unit to provide a decoded data unit; wherein the multiple dimensional encoded data unit may include multiple component codes associated with multiple dimensions; wherein the multiple dimensions may include a plurality of non-uniform dimensions; wherein at least two component codes of each non-uniform dimension differ from each other by encoding rate; wherein the decoding may be responsive to encoding rates of component codes of the plurality of non-uniform dimensions.

The majority of dimensions of the multiple dimensions may be non-uniform dimensions.

All of the multiple dimensions may be non-uniform dimensions.

The method may include assigning higher reliability to a result of a decoding of component code of lower encoding rates than to a result of a decoding of component code of higher encoding rates.

The method may include performing multiple iterations of decoding component code of the multiple dimensions.

The method may include determining reliability levels to be assigned to results of one iteration of decoding component code of the multiple dimensions based upon results of a previous iteration of decoding component code of the multiple dimensions.

The component codes of the plurality of non-uniform rates may be encoded using a set of encoding rates that may include a first encoding rate and a second encoding rate that is higher than the first encoding rate; wherein the decoding may include performing a first decoding process of decoding only component codes encoded with the first encoding rate; and performing in response to the first decoding results a second decoding process of the other component code encoded with the second encoding rate.

The performing of the first decoding process may include decoding only component codes encoded with the first encoding rate and belonging to a certain non-uniform dimension out of the plurality of non-uniform dimensions to provide the first decoding results; and wherein the performing of the second decoding process may include decoding only component codes encoded with the second encoding rate and belonging to another non-uniform dimension out of the plurality of non-uniform dimensions.

The first decoding results may be indicative of suggested values of component codes encoded with the first encoding rate; and wherein the method may include performing the second decoding process while assigning the suggested values to bits that belong to both component codes encoded with the first encoding rate and to component codes encoded with the second encoding rate.

The first decoding results may be indicative of first suggested values of component codes encoded with the first encoding rate; and wherein the method may include performing the second decoding process to provide second suggested values of component codes encoded with the second component codes and invalidating second suggested decoding results due to suggested correction to bits that belong to both component codes encoded with the first encoding rate and to component codes encoded with the second encoding rate that differ from first suggested values of component codes.

The method may include initializing the second decoding process with the first decoding results.

The first decoding results may be indicative of first suggested values of component codes encoded with the first encoding rate; and wherein the method may include performing the second decoding process to provide second suggested values of component codes encoded with the second component codes and reducing a reliability of second suggested values to bits that belong to both component codes encoded with the first encoding rate and to component codes encoded with the second encoding rate that differ from first suggested values of component codes.

The decoding may include performing initial decoding iterations to provide unsolved intersection bits wherein the unsolved intersection bits belong to sets of component codes that were not successfully decoded during the initial decoding iterations wherein the component codes of each set differ from each other by dimension.

The method may include decoding the sets of component codes starting from sets of component codes of lower set encoding rates wherein a set encoding rate is a function of encoding rates of component codes that belong to the set.

The method may include determining to perform decoding of the sets of component codes starting from sets of component codes of lower set encoding rates in response to a failure to decode the unsolved intersection bits.

The method may include changing a value of an unsolved intersection bit to a modified value to provide modified component codes of a modified set of components; decoding at least one modified component code of the modified set of components to provide a new decoding result.

The method may include changing values of multiple unsolved intersection bits to modified values to provide modified component codes of modified sets of components; and decoding the multiple modified sets of component codes to provide a new decoding result.

The method may include determining whether to modify a reliability value assigned to the unsolved intersection bit in response to the new decoding result.

The method may include determining whether to modify the unsolved intersection bit in response to the new decoding result.

The at least one non-uniform dimension may include a pair of component codes of different size that are associated with a same number of redundancy bits and may include another pair of component code of a same size that are associated with different numbers of redundancy bits.

The multiple dimensional encoded data unit may include a plurality of folded component codes.

The multiple dimensional encoded data unit may include component codes with minimal amount of intersection bits.

The multiple dimensional encoded data unit may include a plurality of component codes wherein encoding rates of at least some of the component codes are determined in response to expected reliabilities of the folded component codes.

The expected reliabilities of the component codes may be responsive to reliabilities of flash memory cells that are expected to store the component codes.

The expected reliabilities of the component codes may be responsive to reliabilities of flash memory cells that are expected to store the component codes.

The method may include performing a first decoding process of decoding only component codes associated with a higher expected reliability; and performing in response to the first decoding results a second decoding process of the other component code having a lower expected reliability.

The expected reliabilities of the component codes may be responsive to reliabilities of flash memory cells that are expected to store the component codes.

The decoding of a single component code may include suggesting different hypothesis to a value of the component code; decoding each of the different hypotheses to provide different decoding results; selecting up to one selected hypothesis out of the different hypothesis in response to the different decoding results.

The method may include selecting a selected hypothesis that is associated with a most reliable decoding result of the different decoding results.

The method may include selecting a selected hypothesis that is associated with a most reliable decoding result of the different decoding results and if the most reliable decoding result differs by at least a predefined amount from a second most reliable decoding result of the different decoding results.

The method may include assigning to bits of the component code modified reliability values determined in response to the decoding result of the selected hypothesis.

The method may include assigning to bits of the component code reliability values determined in response to the decoding result of the selected hypothesis and to an encoding rate of the component code.

The method may include selecting a number of the different hypotheses in response to an encoding rate of the component code.

The method may include receiving or generating an expected reliability value for each of the different hypothesis before decoding the different hypotheses; determining a reliability threshold; and initializing a decoding of the different hypotheses starting from lower expected reliability hypothesis and ending with higher expected reliability hypothesis.

The method may include stopping the decoding process of the different hypotheses if a decoding result of another hypothesis reached the reliability threshold.

The method may include performing multiple iterations of decoding component code of the multiple dimensions; wherein a decoding of each component code may include suggesting different hypotheses to a value of the component code; decoding each of the different hypothesis to provide different decoding results; selecting up to one selected hypothesis out of the different hypothesis in response to the different decoding results.

The method may include starting with a decoding of component codes of lower encoding rates and then continuing to decoding of component codes that further may include component codes of higher encoding rates in following iterations.

The method may include performing for each dimension the following starting with a decoding of component codes of lower encoding rates and then continuing to decoding of component codes that further may include component codes of higher encoding rates in following iterations.

The method may include increasing a number of component codes to be decoded during each iteration.

The method may include determining a size of increment of the number of component codes in response to an outcome of at least one completed iteration.

The selection of up to one selected hypothesis of each component code may be based upon a selection criterion; and wherein the method may include changing the selection criterion during the multiple iterations.

The changing of the selection criterion may be responsive to an encoding rate of a component code associated with the selection criterion.

The changing of the selection criterion may be responsive to an outcome of at least one iteration of the decoding.

The method may include starting with a decoding of component codes of lower expected reliability and then continuing to decoding of component codes that further may include component codes of higher expected reliability.

The expected reliabilities of the component codes may be responsive to reliabilities of flash memory cells that are expected to store the component codes.

There may be provided a non-transitory computer readable medium that stores instructions that once executed by a computer causes the computer to receive or generate a multiple dimensional encoded data unit; and decode the multiple dimensional encoded data unit to provide a decoded data unit; wherein the multiple dimensional encoded data unit may include multiple component codes associated with multiple dimensions; wherein the multiple dimensions may include a plurality of non-uniform dimensions; wherein at least two component codes of each non-uniform dimension differ from each other by encoding rate; wherein the decoding may be responsive to encoding rates of component codes of the plurality of non-uniform dimensions There may be provided a method for non-uniform multiple dimensional encoding the method may include receiving or generating a data unit; and encoding by a processor the data unit to provide multiple dimensional encoded data unit; wherein the multiple dimensional encoded data unit may include multiple component codes associated with multiple dimensions; wherein the multiple dimensions may include a plurality of non-uniform dimensions; wherein at least two component codes of each non-uniform dimension differ from each other by encoding rate.

The method may include determining the different coding rates based on channel information indicative of reliability of different component codes.

There may be provided a system may include an interface arranged to receive a data unit; and a processor that is arranged to encode the data unit to provide multiple dimensional encoded data unit; wherein the multiple dimensional encoded data unit may include multiple component codes associated with multiple dimensions; wherein the multiple dimensions may include an non-uniform dimension; wherein component codes of the non-uniform dimension may include at least two component codes that are encoded using different coding rates There may be provided a method for non-uniform multiple dimensional decoding the method may include receiving or generating a multiple dimensional encoded data unit; and performing for each dimension of multiple dimensions associated with the multiple dimensional encoded data unit multiple decoding iterations of component codes that belong to the dimension and differ from each other by decoding rate.

The method may include performing initial decoding attempts of only component codes of higher decoding rate than other component codes of the dimension to provide initial decoding attempt results.

The method may include performing in response to the initial decoding attempts results additional decoding attempts.

The at least a majority of the multiple decoding attempts involve soft decoding attempts.

The multiple decoding attempts are soft decoding attempts and wherein the method may include altering soft decoding parameters as a function of at least one parameter out of a dimension and a number of attempts.

Each decoding attempt may include evaluating different candidates for values of bits of the data unit.

The method may include determining evaluating parameters as a function of at least one parameter out of a dimension and a number of attempts.

There may be provided a non-transitory computer readable medium that stores instructions that once executed by a computer causes the computer to receive or generating a multiple dimensional encoded data unit; a perform for each dimension of multiple dimensions associated with the multiple dimensional encoded data unit multiple decoding attempts of component codes that belong to the dimension and differ from each other by decoding rate.

There may be provided a system that may include an interface arranged to receive a multiple dimensional encoded data unit; and a processor that is arranged to perform for each dimension of multiple dimensions associated with the multiple dimensional encoded data unit multiple decoding attempts of component codes that belong to the dimension and differ from each other by decoding rate.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 11 illustrates a method according to an embodiment of the invention;

FIG. 12 illustrates a method according to an embodiment of the invention;

FIG. 13 illustrates a method according to an embodiment of the invention; and

Figure 1:
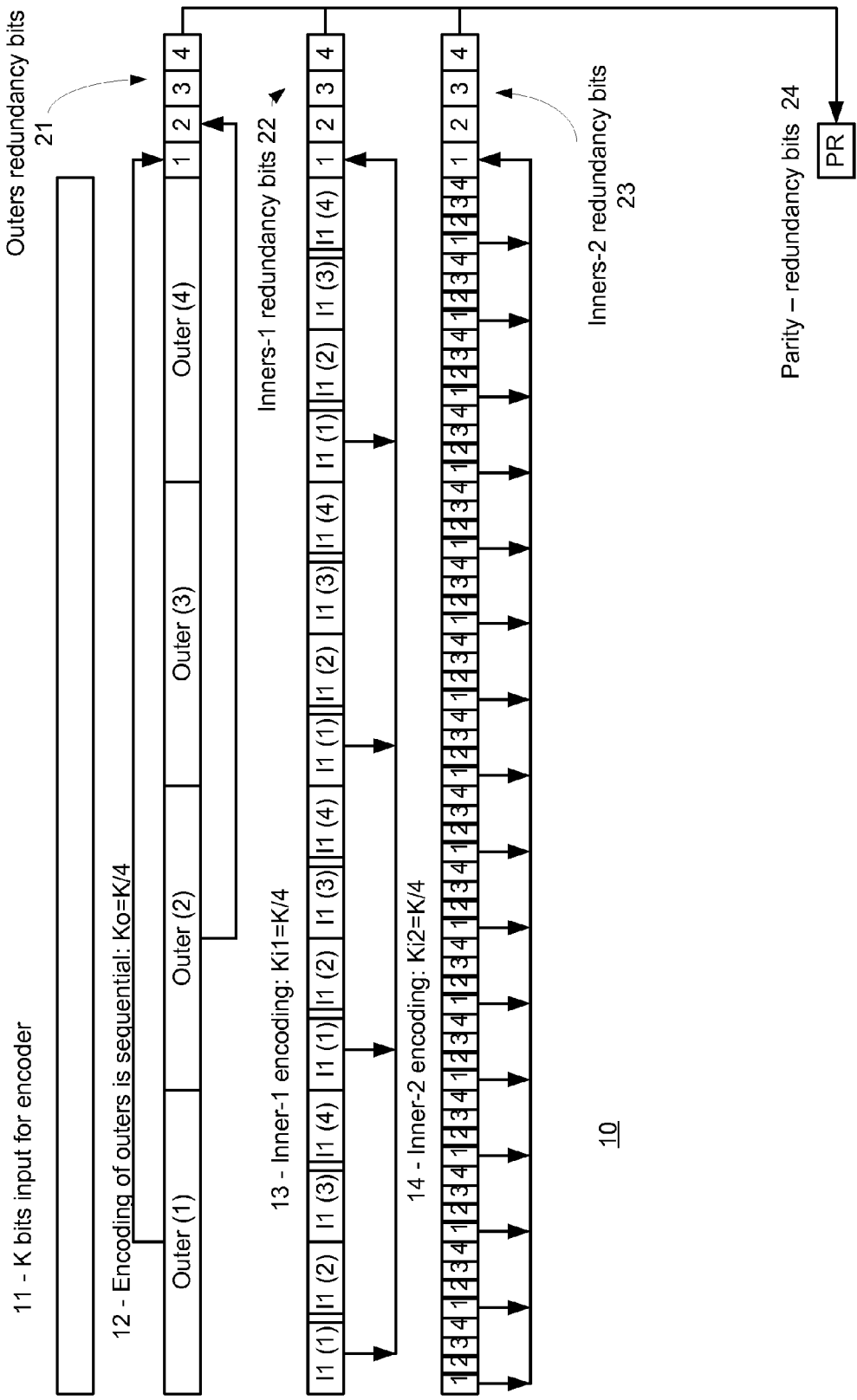
FIG. 1 illustrates an encoding scheme.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

Any reference to an encoding process or to an encoder can be applied mutatis mutandis to a decoding process or to a decoder.

The term data unit may include one or multiple bits. The data unit may have any size and is not limited to a byte. Multiple data units may form a packet.

A codeword include a data unit and all redundancy bits associated with the data unit.

A component code includes multiple bits of the data unit and can be an atomic unit of encoding. One or more redundancy bits are appended to each component code. Each bit of a data unit may belong to multiple component codes.

When encoding a data unit by a multiple dimension encoding scheme each dimension has its own component codes. A non-uniform dimension is a dimension that has at least two component codes that differ from each other by their encoding rate.

FIG. 1 depicts a multi-dimensional encoding scheme where encoding is performed in three dimensions. The upper part 11 represents K information bits, which are the payload. The encoding of each dimension is illustrated right below. The first dimension 12 is an outer code dimension, where 4 equal portions of the payload are taken directly from the K information bits one after the other. For every portion the same component encoder is used for generating it redundancy 21, e.g. Outer (1) generates redundancy (1), etc. For a second dimension 13, the same K-input bits are divided into 4 equal portions as well, and encoded again with the same component encoder. However, every portion captures another part of the K input bits, which effectively have only K/16 overlapping bits of any two code of current (Inner-1) and previous dimension (Outer). This dimension is called Inner-1, and for the payload denoted by I1(1) the component encoder generates redundancy (1) 22, etc. The third dimension 14 here is called Inner-2 having redundancy bits 23. For its encoding, the same K-input bits are divided into 4 equal portions as well, and encoded again with the same component encoder. However, every portion captures another part of the K input bits, such that only K/64 input bits will be common to any set of component codes from different dimensions, an example for a set is {Outer(2), I1(4), I2(3)}. Finally, there is a last encoding stage of the redundancy of all dimensions, called Parity encoder, which generates PR, the parity redundancy bits 24.

There is provided a multi-dimensional encoding, which comprises of multiple components codes in each dimension. In every dimension: every component code encodes a different portion of the input data, and the component encoders may differ from each other.

According to embodiments of this invention, for every dimension: every component code may have a different coding rate. This can be obtained by (i) Using same component encoder operating on different input sizes; (ii) same input size but different encoders, i.e. different redundancy sizes for distinct payload portions of equal size; (iii) or mixture of (i) and (ii)—i.e. for maximal flexibility and low complexity implementation—for example, create two distinct payload sets, from the first set take unequal distinct portions and use a single encoder, and for the other set take equal distinct portions and encode each portion with a different encoder (generating a different redundancy size).

Such encoding provides stronger error correction capabilities for some portions of the input. This property is used in the invention during decoding, to achieve efficient decoding.

Employing an interleaving scheme among dimension, which allows encoding on the fly—as the payload data enters, i.e. when the last payload byte enters the encoder, the encoding is nearly done.

There is provided interleaving and encoding which combines channel information with the rate allocation for the component codes. For example, if part of the codeword is expected to have more errors, then the stronger component-codes of each dimension may be used to encode this part of the codeword.

According to an embodiment of the invention there is provided a method for multi-dimensional hard decoding. The multi-dimensional decoding includes performing initial iterations in which only stronger component codes are decoded, and on later iterations decoding continues with all component codes. Stronger component codes are component codes, which were encoded at lower code rate according to embodiments of this invention.

This may be followed by forcing (changing) of hard decoding results of stronger component codes can be used to reduce false corrections during iterative hard decoding.

Furthermore, the method may include adaptively adding more and more component codes to take place in iterative decoding according to number of solved component codes.

The method may include intersections decoding that may take place on stronger component codes prior to attempting weaker codes' intersections. If a progress is obtained with stronger codes decoding, then the intersections decoding stops and the iterative multi-dimensional decoding may proceed When channel side information is available, meaning that the BER is not equally distributed over the codeword, and a part of the codeword may have higher BER. The encoding may take this into account as mentioned earlier, and the decoding may start on the initial iterations with the part of the codeword which has a lower BER, and apply forcing on this part of the data, and only then continue to the component codes with higher BER There is provided a method for multi-dimensional soft decoding.

The multi-dimensional decoding may include during initial iterations during which only stronger component codes are decoded using soft-input per component-codeword, and on later iterations, decoding continues with all component codes. Stronger component codes are component codes, which were encoded at lower code rate according to embodiments of this invention.

The method may include changing of per bit reliability values represented for example by their log-likelihood ratio (LLR) values, of stronger component codes, for soft decoding of component codes for which sum-LLR and diff-Sum-LLR meet a threshold condition, can be used to reduce false corrections during iterative soft decoding, and increase the convergence time, which reduces overall decoding complexity.

Assign a different changing value of LLRs to solved component codes, according to:
a. Code rate of solved component-codeword, the lower the code-rate the higher is the reliability of its solution.
b. Sum-LLR and Diff-Sum-LLR of accepted solution for a component-codeword.

The method may include adaptively adding more and more component codes to take place in iterative soft-decoding according to number of solved component codes The method may include adaptively changing the sum-LLR and Diff-Sum-LLR thresholds with respect to code rate of the different component codes.

The method may include changing the sum-LLR and Diff-Sum-LLR thresholds as function of the component and iteration—this is used to minimize false corrections and allows reliable decoding.

The method may use an enumeration list size per component-codeword—that may be may be set with respect to its rate and component-codeword length. Since, the higher expected error rate, the larger the enumeration list size can be.

The method may include applying an early termination threshold—with different threshold value according to component-codeword strength and the iteration count.

When channel side information is available, meaning that the BER is not equally distributed over the codeword, and a part of the codeword may have higher BER. The encoding may consider this as mentioned earlier, and the decoding may start on the initial iterations with the part of the codeword which has a lower BER, and apply changing on this part of the data, and only then continue to the component codes with higher BER.

There is provided a method for constructing a configurable and efficient encoder/decoder, which may operate iteratively to bring about low frame error probabilities with a high performance. This code is especially suited for high rate codes where only a small portion of the codeword is allocated for redundancy.

A code rate is defined by the ratio of its information content, called payload, to the overall size of the codeword. For example, for a code that contains k bits and r redundancy bits that rate is defined by $R_C=k/(k+r)$. The common encoding methods are not very well suited to support high rate codes when both hard and soft decoding are considered. For example, for conventional LDPC codes for very high rates (say 0.9) with low error floor and high reliability requirements, the code length tends to be considerable resulting in a very complex and costly implementation. We present here a code construction based on simple component codes, e.g. BCH components, which may be implemented very efficiently and resulting in a much smaller implementation. The application of iterative decoding allows for much better results than those, which would have otherwise been obtained by any of the component codes.

Some embodiments of this invention include the special structure of the code. It is its special structure of multi-dimensional encoding with the simple component codes that enables obtaining high decoding efficiency with a reasonable complexity for both hard input and soft input to the decoder.

These properties make this code especially suitable for storage applications such as NAND Flash devices or controllers for NAND flash. Some key features of the introduced coding scheme are instrumental in designing a coding system for storage, and include:

a. High raw bit error rate (RBER) error correction capability with hard input to the decoder—this is important in storage systems since it requires a single read operation. This means that high performance on read from the storage device may be achieved throughout the device lifespan.

b. Configurability—the code rate may be configured per application, and with a single engine, it is possible to configure with firmware the code parameters, which determine the payload size and redundancy size. This feature allows using different codes for different type of pages, according to their RBER characteristics. Alternatively, payload size can be determined such that the tradeoff of performance vs. reliability is optimized.

c. High raw bit error rate (RBER) error correction capability with soft input to the decoder—this is important in storage systems since it enables to provide high reliability at high P/E cycle counts and difficult retention conditions. This is crucial for storage systems, which usually require an output smaller undecodable bit error rate (UBER) of 1E-15.

According to an embodiment of this invention, a multi-dimensional encoding is employed, where every dimension is encoded with possibly multiple different component codes. In every dimension: every component code encodes a different portion of the input data, and the component encoders may differ from each other.

According to an embodiment of this invention, in every dimension: every component code may have a different coding rate. This can be obtained by using same component encoder operating on different input sizes. The advantage of this approach is its simplicity for implementation, e.g. a BCH component encoder can be implemented, where the portions taken from the input payload per component may change, while applying the same encoding process which generates the same number of redundancy bits for every component, originating from different portion sizes of the systematic input bits.

According to another embodiment of this invention, the encoding for every dimension is done by using the same input size per component encoder, but different component encoders, which generate different redundancy sizes for distinct payload portions of equal size.

According to another embodiment of this invention, mixture of the above multi-dimensional encoding techniques may be used. That is, an encoder can employ multi-dimensional encoding, and in every dimension employ different strategies. E.g., encoder creates three distinct payload sets. On the first set, use several identical component encoders, which encode equal size distinct payload portions, from the second set take unequal distinct portions and use a single encoder, and for the third set take equal distinct portions and encode each portion with a different component encoder (generating a different redundancy sizes).

Such encoding provides stronger error correction capabilities for some portions of the input. This property is used in the invention during decoding, to achieve efficient decoding.

Figure 2:
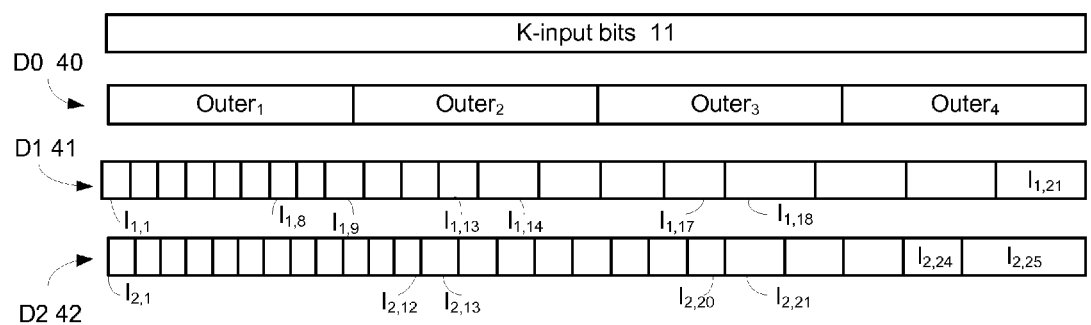
FIG. 2 illustrates an encoding scheme according to an embodiment of the invention.

FIG. 2 depicts an example of a coding scheme according to an embodiment of this invention.

A three dimensional encoding is exemplified, where the K-input bits 11 are partitioned differently for encoding in each of the 3 dimensions. On the first dimension denoted by D0 40 the K-input, bits are partitioned into 4 distinct portions (four component codes) of equal size denoted by $Outer_1$-$Outer_4$. All outer component encoders can be identical, i.e. generate equal size redundancy, or may be different providing a different protection level to different portions. On the second dimension, denoted D1 41, the K-input bits are partitioned into 21 distinct portions (distinct component codes) of unequal size—so that D1 is an non-uniform dimension. The first group includes portions (component codes) $I_{1,1}$-$I_{1,8}$ of equal size, and the second group $I_{1,9}$-$I_{1,13}$ of equal size includes larger payload than the first group. This continues up to group $I_{1,18}$-$I_{1,21}$ of equal size and largest payload per component encoder. When identical encoders are used per component, e.g. BCH code over $GF(2^Q)$ with $D_{min}$, i.e. correction capability $t=(D_{min}-1)/2$, every group receives a different protection. That is the first group $I_{1,1}$-$I_{1,8}$ can accommodate highest RBER (assuming that errors are equally distributed along the codeword). Naturally, the encoding within every group may consist of different component encoders, and then the protection level of every component codeword within a group may be different. On the third dimension, denoted D2 42, the K-input bits are partitioned into 25 distinct portions of unequal size—so that D2 is also an non-uniform dimension. The first group includes portions (component codes) $I_{2,1}$-$I_{2,12}$ of equal size, and the second group $I_{2,13}$-$I_{2,20}$ of equal size includes larger payload than the first group. This continues up to group $I_{2,25}$ that is the last component codeword payload. When identical encoders are used per component, e.g. BCH code over $GF(2^{Q'})$ with $D'_{min}$, every group receives a different protection. The data in each dimension of this example is interleaved before the component encoders. This means that the payload for each component codeword as depicted in FIG. 2 is taken from the output of an interleaver. The parity bits of the three-dimensional component encoders may be encoded with an additional code, called a parity encoder.

Figure 3:
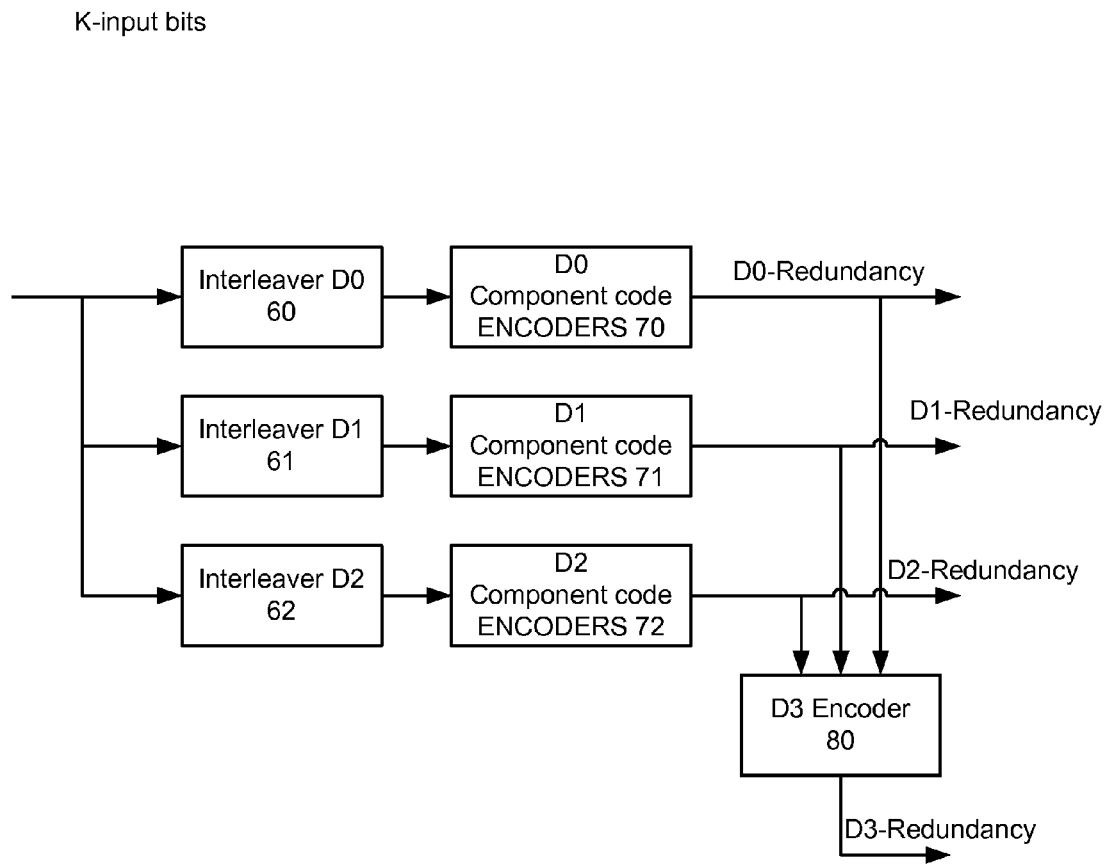
FIG. 3 illustrates a portion of a system according to an embodiment of the invention.

FIG. 3 illustrates a system 90 for three-dimensional encoding according to embodiments of this invention.

The K-input bits are used by separate encoders in each dimension. The input is permuted per dimension. For D0 there is an interleaver D0 60, and its output is used by different D0-component encoders 70, according to embodiments of this invention. Similarly, in D1 there is an interleaver D1 61, and its output is used by different D1-component encoders 71. Finally, in D2 there is an interleaver D2 62, and its output is used by different D2-component encoders 72. The output in each dimension is D0-redundancy (of D0-component encoders), D1-redundancy and D2-redundancy, which can be are all together encoded by D3 Encoder 80. In a systematic code the codeword shall consist of the original K-input bits, the redundancy bits D0-redundancy, D1-redundancy, D2-redundancy, and D3-redundancy.

According to an embodiment of this invention, a multi-dimensional encoding can be performed on the fly by using a different interleaving scheme per dimension. The term "on the fly" refers to the encoding process that can be done simultaneously on all three dimensions as the input bits are received, without introducing any noticeable delay associated with the interleaving of each dimension. Since separate component encoders are used per dimension the interleaving scheme in each dimension simply associates every input location with its component encoder index. Every component encoder operates on its own input sequentially, and in order to perform the encoding on the fly, the interleaver selects the encoder per input bit. This can be implemented, for example, with either BCH component codes or convolutional codes.

According to an embodiment of this invention, a multi-dimensional encoding can be performed such that the average size of intersections between component codes of different dimensions is minimized. A method for minimizing the average intersections size can be allocating the component codes' payload indices for first dimension, then determining the allocation of payload indices for next dimension by using a permutation which minimizes the average (or maximal) number of common indices from every two component codes of different dimensions. This continues for a third dimension, where now the permutation minimizes the intersection of every three-component codes, each on a different dimension.

Figure 4:
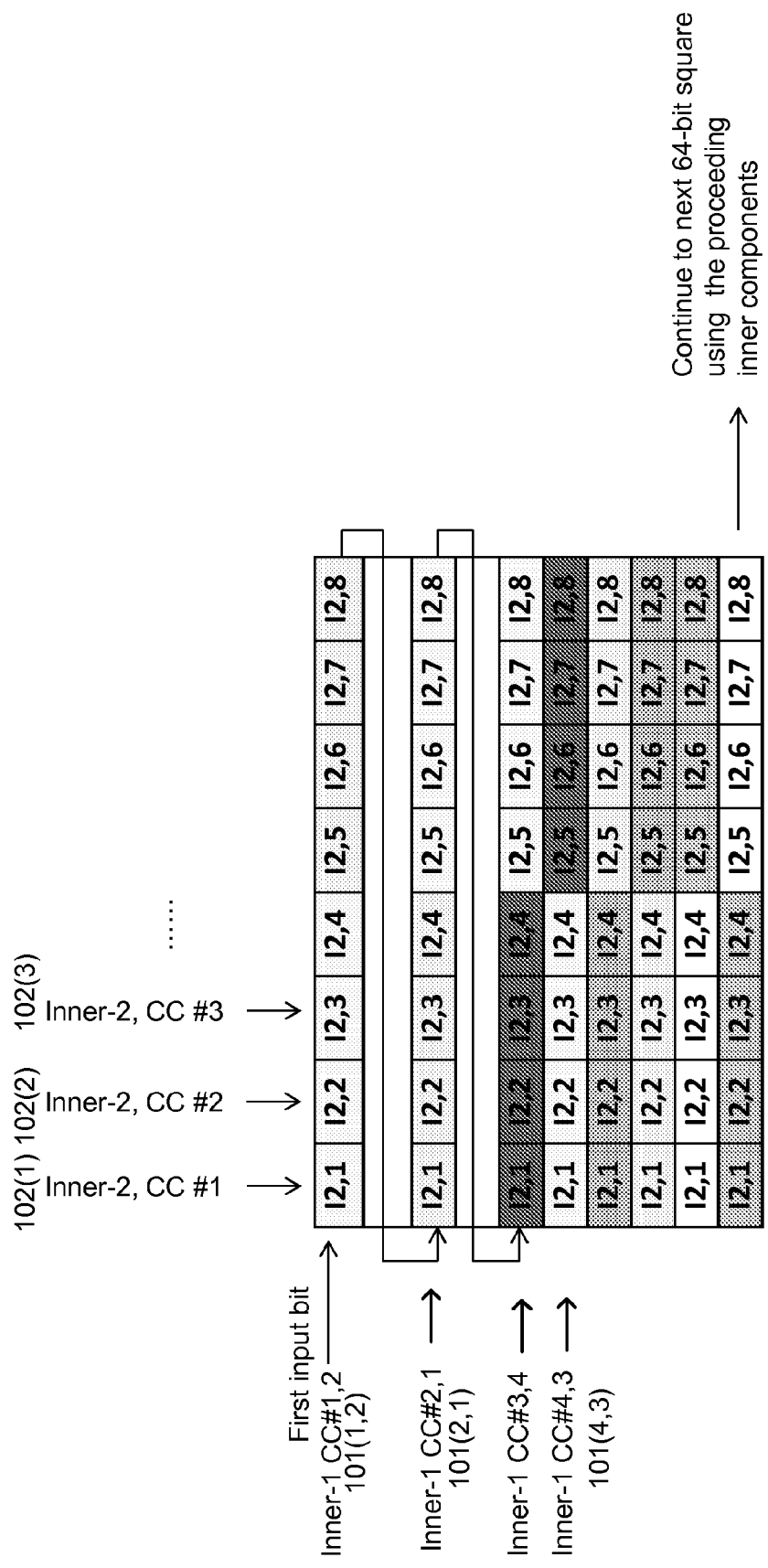
FIG. 4 illustrates 64 bits of a data unit that are associated with sixteen parts of sixteen component codes according to an embodiment of the invention.

FIG. 4 depicts an exemplary two-dimensional interleaving, which can be used for encoding on the fly, according to embodiments of this invention.

As may be noticed in FIG. 4, the component-codes of two dimensions are interleaved in successive chucks of eight bytes. Every 64 input bits can be represented as a square matrix 100 of 8×8 cells that includes eight inner-1 codewords and eight inner-2 codewords. The bits are fed one row after the other. For Dimension 2, which is denoted by Inner-2 (each column may include a codeword such as codewords 102(1)-102(8)), a component encoder receives a single column for encoding 8 bits.

In FIG. 4 the temporary content of 64 bits are shown. It is assumed that each component codes includes a multiple integer of bytes—and a single byte per component code is shown in FIG. 4. The mapping between bits and component codes for the next 64 bits may differ from those illustrated in FIG. 4.

That is, the first component code in Inner-2 receives all bits marked as I2,1. The second component in Inner 2, receives for encoding all bits marked as I2,2, etc. For Dimension 1, every component encoder receives 8 bits from a double row. Actually, there are two options here:

a. A single component encoder can receive a single row consisting of 8 bits.

b. A first nibble from the first row, and another nibble from the second row, etc.

The second option enables using byte interleaving, with equal protection of all component codes. This option is also demonstrated in FIG. 4, where every 8 bits, which belong to a single component encoder, are marked with the same color, and every other component code received a different color.

According to another embodiment of this invention, for every 8-Bytes input (which is a single interleaving square), a different combination of component codes per dimension can be used, such that the two involved dimensions are well interleaved. The design figure of merit may be to minimize the input bits overlap of any two-component codes from distinct dimensions. E.g. when encoding in squares as demonstrated in FIG. 4, only a single information bit is common for two distinct component encoders.

According to another embodiment of this invention, when encoding of 3 dimensions is desired, two dimensions may enjoy the interleaving scheme suggested in FIG. 4, while the $3^{rd}$ dimension may be encoded sequentially, i.e. take continuous chunks of payload per component code. In such scheme a 3 dimensional interleaving may be obtained, with minimal overlap of information bits in any three-component codes from distinct dimensions.

Figure 5:
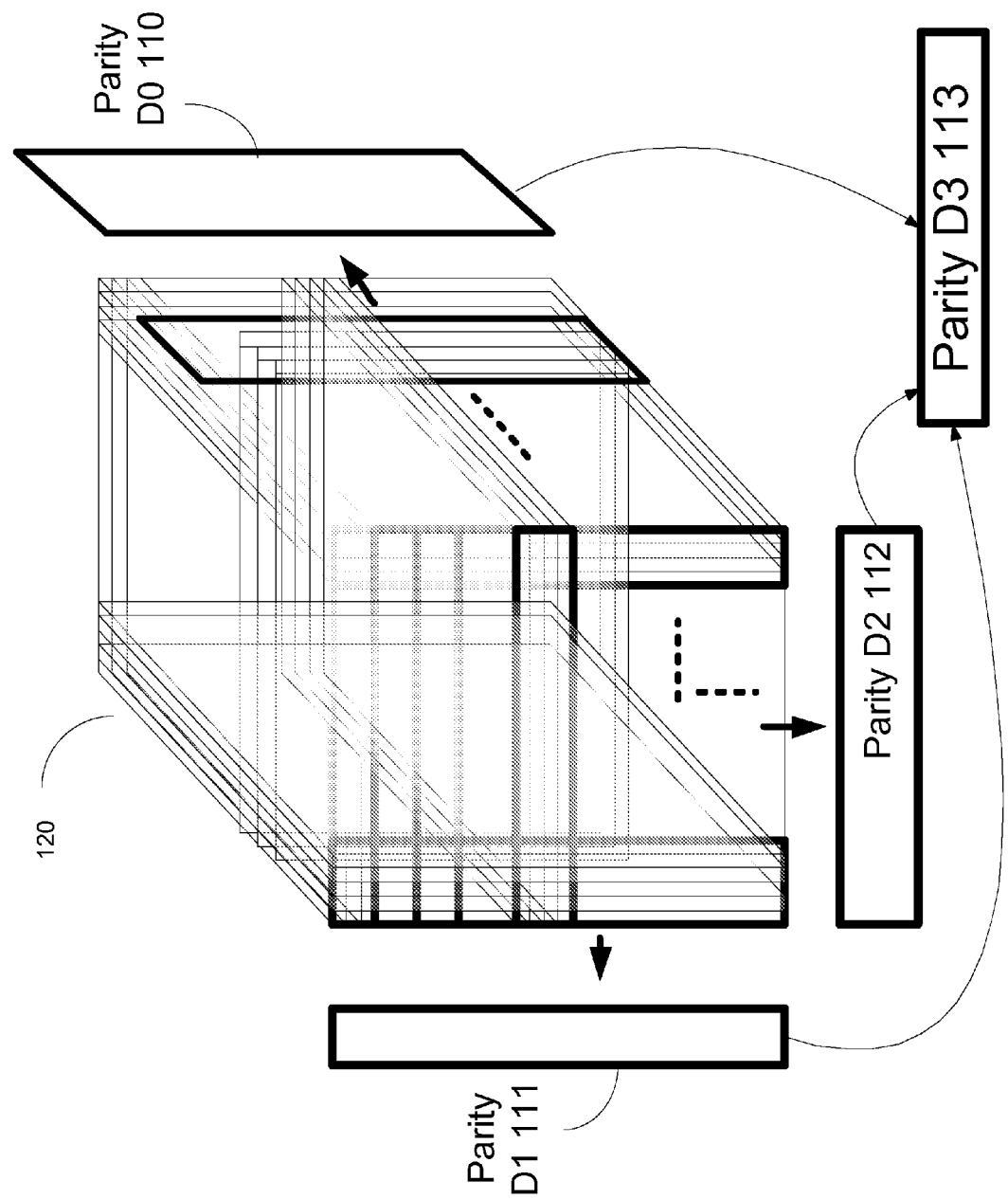
FIG. 5 illustrates a three dimensional codeword according to an embodiment of the invention.

FIG. 5 depict a 3-dimensional encoding scheme of mixtures of code rates, according to embodiments of this invention. The input is represented by some cube 120, where for encoding a dimension the component encoders take as input a few partial or full layers from the corresponding dimension. This figure illustrates parity D0 110, parity D1 111, parity D2 112, and parity D3 113. For example, to generate Parity D2 112, the first component encoder takes three horizontal layers of input data from the cube. The second component encoder may take another number of horizontal layers. Every component encoder can use multiple layers, and maybe partial layers. This scheme enables encoding of folded BCH codes for example, where every component code generates the same redundancy size, while receiving a different number of input bits, and thus achieving different protection capability per component code.

An exemplary method for generating such codes is by using an interleaving scheme as depicted in FIG. 4, with BCH component codes which correct t errors each, and their payload size is determined by $$L(idx) = \begin{cases} L_s & idx < M_0 \\ L_s + L_0 & M_0 \le idx < M_1 \\ L_s + L_0 + L_1 + a_0 \cdot \lfloor a_1 \cdot (idx - M) \rfloor & idx > M_1 \end{cases}$$

Where 0<idx<N for N component codes, and idx is a packet index. There are $M_0$ short component codes of length $L_s$ and a second set of different length components. The codes with indices greater than M1 have a linearly growing length with the code index. Length unit may be in Bytes.

As an example, for the case there are 59 codes in each dimension, and $M_0$=10, $M_1$=30, $a_0$=20, $a_1$=0.1, $L_S$=45 [Bytes], $L_0$=10 [Bytes], $L_1$=10 [Bytes] results in the following sizes per component code: lengths in bytes of 45, 55, 65, 85 and 105 respectively resulted in number of packets of 9, 20, 10, 10 and 10 respectively.

According to another embodiment of this invention, interleaving and encoding may combine channel information with the rate allocation for the component codes. For example, if part of the codeword is expected to have more errors, then the stronger component-codes of each dimension may be used to encode this part of the codeword. This can be implemented by using for example identical component codes with variable payload sizes. The shorter payload component codes will be used for encoding the part of the data, which may have a higher BER.

Multi-Dimensional Hard Decoding

Figure 6:
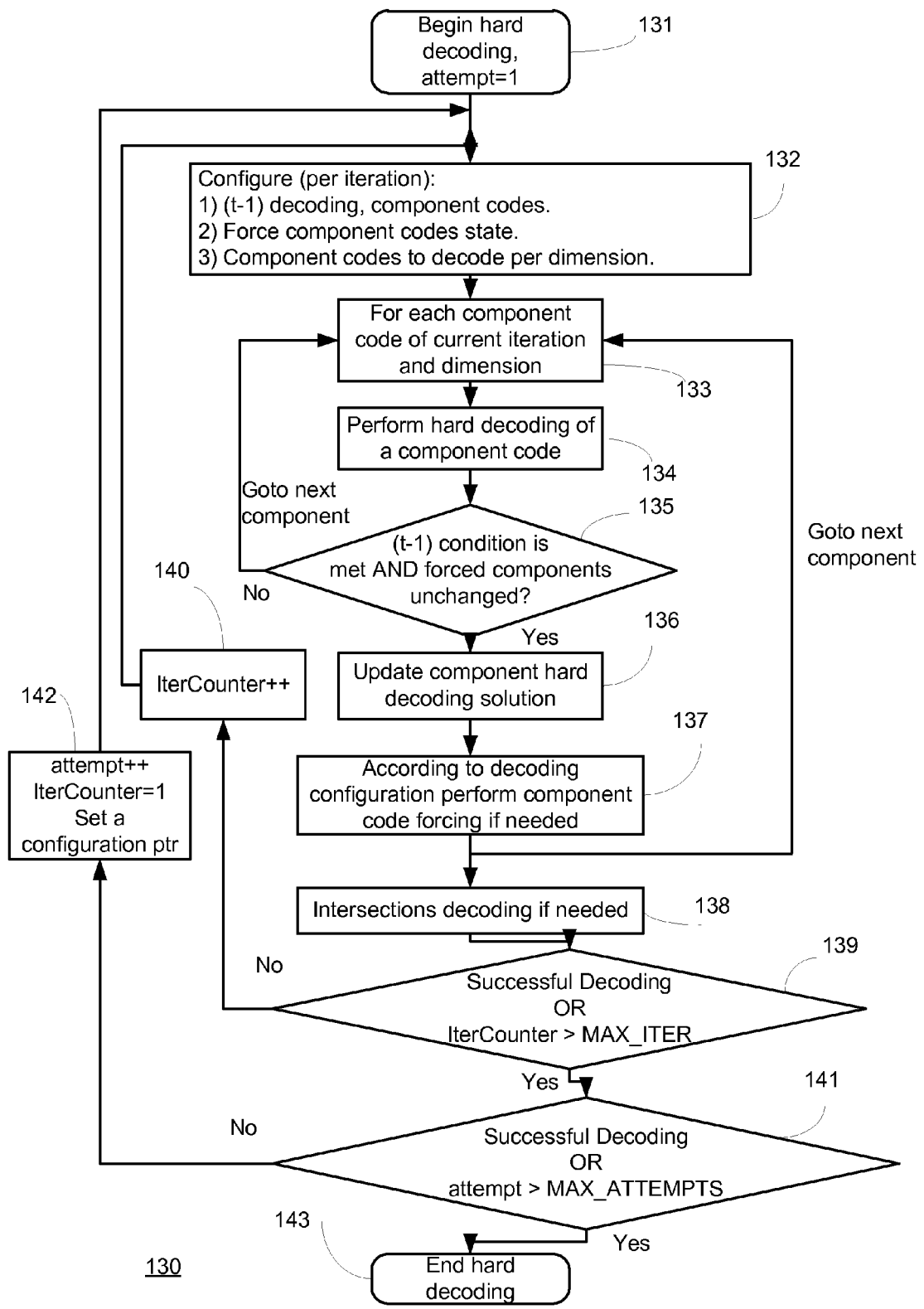
FIG. 6 illustrates a method, according to an embodiment of the invention.

FIG. 6 describes method 130 for multi-dimensional iterative hard decoding according to an embodiment of the invention.

A basic iteration includes attempting to decode all the component codes, at each dimension. At the first iteration there may be cases where only the inner codes may be using during decoding due to implementation considerations. Sometimes the inner component codes decode only few errors, e.g. t<4 per BCH component code, thus the decoding per component can be very efficient. In Flash memories, the read performance depends on the decoder latency, therefore high speed decoding is instrumental for achieving high read performance. When the number of errors is not too high it is usually possible to complete successful decoding using iterative inner decoding only, at extremely low latency.

As may be noticed in FIG. 6, when inners decoding is not successful, other types of multi-dimensional decoding can be attempted.

Referring to FIG. 6—method 130 starts by stage 131 of starting hard decoding and set a variable named attempt to 1.

Stage 131 is followed by stage 132 of configuring (per iteration):
a. (t−1) decoding, component codes;
b. force component-codes state;
c. Component codes to decode per dimension.

where (t−1) decoding refers to low false correction probability during decoding by using reduced decoding capabilities. That is, a simplified approach is to accept correction of up to one error less than the BCH code correction capability t. For a BCH component with some $D_{min}$ the correction capability is $$t = \frac{D_{min} - 1}{2},$$

and in (t−1) decoding mode only fixes, which include up to (t−1) errors are accepted.

Stage 132 is followed by stage 133 of for each component code of current iteration and dimension.

Stage 133 is followed by stage 134 of Perform hard decoding of a component-code.

Stage 134 is followed by stage 135 of checking if (t−1) condition is met AND if forced components are left unchanged.

If yes—jumping to stage 136 of update component hard decoding solution.

If no—jumping to stage 133.

Stage 136 is followed by stage 137 of performing component code forcing if needed—according to decoding configuration.

Stage 137 is followed by stages 133 and 139. Stage 139 include checking if there was a successful decoding OR IterCounter>MAX_ITER.

If yes—jumping to stage 141 of checking if Successful Decoding OR attempt>MAX_ATTEMPTS.

If no—jumping to stage 140 of increasing IterCounter IterCounter++

Stage 140 is followed by stage 132.

Stage 141 is followed by stage 143 of ending the hard encoding.

Another type of decoding for BCH components may include (t−1) limited corrections per BCH component. This stage is also aimed at minimizing the false corrections by performing BCH corrections, which have lower false correction probability. A simplified approach here is to perform correction of up to one error less than the BCH code correction capability t. For a BCH component with some $D_{min}$ the correction capability is $$t = \frac{D_{min} - 1}{2}.$$

To increase probability of reliable correction, a few iterations where only less than t errors are corrected are performed. Every component code has a code spectrum, which can be utilized for this purpose. Define a probability distribution P(n,e) where 0<n<t is the number of false error detection after the BCH decoding, and e is number of input errors (e>t). After decoding such a BCH component code with e>t there will be additional errors according to $$P_n(m) = \sum_{e=t+1}^{N} P(m, e)$$

where N is the codeword length (including parity bits) of the component code. Thus the restriction to m corrections per code may change every iteration with an increasing false correction probability.

The above two stages of (t−1)-limited decoding and multi-dimensional iterative decoding can each be carried out for $M_0$>0 and $M_1$>0 iterations, respectively. Note that if $M_0$=0 then there are no (t−1) decoding iterations. Such configuration is valid for fast decoding.

If the decoding does not succeed with the decoding strategies described so far, it is possible to use more advanced methods. Since multi-dimensional codes are used, every input bit is encoded by multiple codes. Therefore, using intersections decoding may be very useful. On some cases during the hard iterative decoding it may be beneficial to perform a complexity limited intersections decoding. A possible scenario for using intersections decoding is when there are still some decoder components with missCorrection=1, and there is no further progress of the hard iterative decoding.

Non-solved intersection bits are defined as information bits which belong to distinct component codes, which are all non-solved, i.e. have missCorrection=1. The more component codes used in every dimension, the smaller is the bit-set of intersection between the component codes. In the variable rate folded BCH codes, according to this invention, the intersection bit-set length may change, as the payload size of component codes on the same dimension may differ.

The main steps of intersections decoding are:

Mapping of bit-sets which are obtained by intersections of components with missCorrection=1 on different dimensions.

Limit the intersections bit-sets list size (if needed).

Determine the dimensions for which decoding is to be applied.

Determine the number of bits for enumeration—this specifies the enumeration complexity, which is bounded by $$\binom{L_b}{N_b},$$

where $N_b$ is the number of bits, which are simultaneously, flipped every intersection's decoding, and $L_b$ is the number of bits in a single bit-set intersection.

For every selected intersection set enumerate over the intersection bits, where every time another $N_b$ bits are flipped, and try decoding the corresponding component codes on the selected dimensions. This enables correcting t+Nb errors on a single component code.

Accept the inversion of $N_b$ bits as valid solutions (of an intersection bit-set) if missCorrection=0 after decoding, for a number of components exceeding some threshold (a special case here can be a single component, for a zero threshold).

Detailed Description of Multi-Dimensional Hard Decoding

According to an embodiment of this invention, all component codes can be used to determine the list of intersections, while the actual decoding with enumeration of error hypothesis may be done on some or all associated component codes. In other words, it may be sufficient to decide upon error hypotheses by using two component codes of different dimensions, and not using all available dimensions. This may save computational complexity.

According to an embodiment of this invention, when using component codes of variable rate as specified in encoding section, the iterative multi-dimensional decoding may include performing several iterations for decoding the stronger component codes, and proceed to decode weaker component codes on later iterations.

By stronger component codes we refer to component codes, which were encoded at relatively lower coding rate compared to other component codes on the same dimension. This can be obtained by using same component encoder operating on different input sizes, thus the component codes with smaller input sizes will be considered as the stronger components. Their iterative decoding has higher probability at the initial iterations.

According to an embodiment of this invention, the component codes, which are considered as stronger codes, may have a lower probability of false correction, which means that their solution is highly reliable. This gives rise to forcing the values of strong decoded components. Forcing of component bits means, that when weaker components are decoded at later iterations, their solution is invalidated if any of their corrected bits belongs to a strong solved packets, which is considered forced. This method is reduces the false correction probability of lower rate component codes, which are usually more vulnerable to false corrections.

According to another embodiment of this invention, the iterative decoder adaptively adds more and more component codes to the iterative decoding, according to decoding success during the iterative decoding of different rate components. As an example, on first iteration only the lowest rate codes are decoded. If all of them are solved during the first iteration, then the next iteration can include the next set of higher rate codes. Otherwise, an additional iteration with lowest rate codes can take place. If there is a progress in the next iteration with lowest rate codes, then an additional iteration will take place until there is no more decoding progress. Once there is no further decoding progress more component codes are selected, and decoding may continue until no further progress is observed.

According to an embodiment of this invention, intersections decoding may take place on stronger component codes prior to attempting weaker codes' intersections. If a progress is obtained with stronger codes decoding, then the intersections decoding stops and the iterative multi-dimensional decoding may proceed. Only if no progress is made during intersections decoding with strong codes, or all strong codes are solved before intersections decoding, then intersections decoding is attempted with weaker codes.

Figure 7:
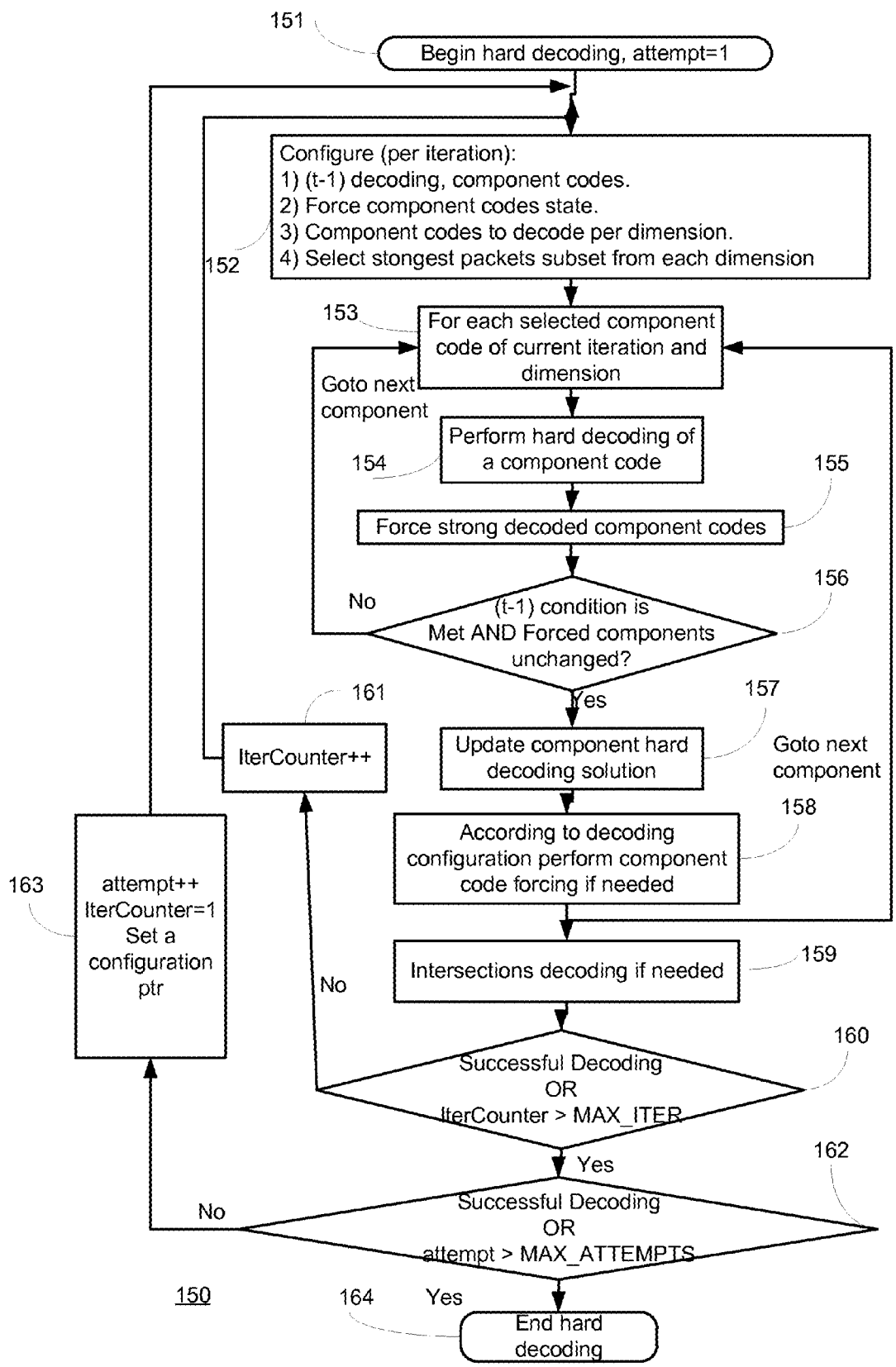
FIG. 7 illustrates a method, according to an embodiment of the invention.

FIG. 7 exemplifies a decoding flow, which incorporates the iterative decoding for multiple rate component codes according to embodiments of this invention.

The flow includes configuring, where the configuration here refers to the decoding strategy parameters of current decoding attempt, (152) for every decoding attempt the (t−1) decoding type parameters, the forcing components state, and the component codes selection per dimension according to the protection associated with the component codes for every decoding stage.

For all selected component codes (153), an iterative decoding (154-158) is carried out, where successfully decoded strong codes can be forced, while weaker decoded codes are not forced, when solved, and their solution may be invalidated due to strong codes forcing during iterative decoding.

Intersections decoding (159) can be carried out once there is insufficient progress with the iterative decoding, where the intersections decoding may begin with the strongest component codes, which are not yet solved, and only if no solution is found there continue with weaker component codes. Following some progress with the intersections decoding, the multi-dimensional decoder may proceed to next iteration (160, 161).

If the maximal number of iterations is reached (ItrCounter>MAX_ITER), without successful decoding, another decoding attempt may begin (160, 161). A new attempt includes clearing out older decoder results (suspected errors are removed), configuring the decoder to a new configuration of decoding strategy, e.g. perform more iterations with decoding of strong component codes, add iterations of (t−1) protected decoding, etc. If one of the attempts succeeds, the decoder stops and the corrected data may be used, otherwise, if maximal number of attempts is reached, the decoder stops and declares a failure (164).

Method 150 starts by stage 151 of Begin hard decoding, attempt=1

Stage 151 is followed by stage 152 of configuring (per iteration), where the configuration here refers to the decoding strategy parameters of current decoding attempt:
a. (t−1) decoding, component codes.
b. Force component-codes state.
c. Component codes to decode per dimension.
d. Select strongest packets subset from each dimension.

where (t−1) decoding refers to low false correction probability during decoding by using reduced decoding capabilities. That is, a simplified approach is to accept correction of up to one error less than the BCH code correction capability t. For a BCH component with some $D_{min}$ the correction capability is $$t = \frac{D_{min}-1}{2},$$

and in (t−1) decoding mode only fixes, which include up to (t−1) errors are accepted.

Stage 152 is followed by a control stage 153 for executing the following sequence (stages 154-158) for each selected component code of current iteration and dimension.

Stage 153 is followed by stage 154 of performing hard decoding of a component-code.

Stage 154 is followed by stage 155 of forcing strong decoded component codes—values of component codes calculated during stage 154 are assumed to be true and are provided to these bits.

Stage 155 is followed by stage 156 of checking if (t−1) condition is Met AND Forced components unchanged? The (t−1) condition is that the component code decoder suggests a solution where only up to t−1 errors are to be corrected (for BCH) or any other low false probability decoding criteria for other component codes.

If yes—jumping to stage 157 of updating component hard decoding solution, where updating means accepting the suggested corrections, and applying the bit flips on the suggested errors.

If no—jumping to stage 153.

Stage 157 is followed by stage 158 of perform component code forcing if needed—according to decoding configuration—the configuration of current iteration determines whether or not successfully decoded component codes are forced.

Stage 158 is followed by stage 159 of performing intersections decoding if needed, where intersections decoding may need to take place if there is no progress in the iterative decoding, i.e. there are no new accepted solutions within the current iteration.

Stage 159 is followed by stage 160 of checking if there was a successful Decoding OR IterCounter>MAX_ITER.

If yes—jumping to stage 162.
If no—jumping to stage 161 of IterCounter++.
Stage 161 is followed by stage 152.
Stage 162 includes checking if there was a successful decoding OR attempt>MAX_ATTEMPTS.
If yes—jumping to stage 164 of ending the hard decoding.
If no—jumping to stage 163 of increasing attempt++, setting IterCounter=1 and set a configuration ptr.

Stage 163 is followed by stage 152.

Soft decoding of Multi-dimensional codes

Soft decoding relates to the decoding of soft inputs, providing hard output associated with the corrected information bits.

For soft decoding of a BCH component code (also termed as packet) soft information per bit is required. In Flash memory systems, this is obtained by performing multiple reads from the Flash, where each read operation uses different read thresholds. The read thresholds must be configured such that soft metrics, called log-likelihood ratio (LLR), can be computed per bit. The definition of an LLR is $$LLR(b_i) = \log\left(\frac{P(b_i=1)}{P(b_i=0)}\right)$$

where $b_i$ is the $i^{th}$ bit of some page.

The LLR expression can be substantially simplified, for an additive white Gaussian noise (AWGN) channel model. The AWGN is also a good approximation in many cases for the Flash lobes' distribution. By assuming an AWGN channel, $$P(b_i|y) = \frac{1}{\sqrt{2\pi\sigma^2}\exp\left(-\frac{(y-b_i)^2}{2\sigma^2}\right)}$$

where y is the AWGN channel output.

It is straightforward to show that the LLR(bi) becomes $$LLR(b_i) = \frac{2y}{\sigma^2}$$

where the LLR per bit is created during the multiple Flash reads, as a quantized version of an AWGN channel.

The quantization level per threshold is directly determined by the number of reads, as the base-two logarithm of the read counter. Once, the multiple reads have been conducted, and LLRs are available for all codewords bits, the decoding process begins.

Iterative soft decoding of the multi-dimensional codes includes the process of performing soft decoding on some of the component codes, and applying the most likely corrections (under different conditions, as will be elaborated here). On some component codes it may be desired to perform only hard decoding. An example for such code can be a 3D code where the outer components are BCH codes which correct t>4 errors. If this code has inner-1 and inner-2 BCH components with decoding capability of t<4, then soft decoding may be efficiently implemented here (in terms of computational complexity, or hardware implementation).

Soft decoding of a single component code consists of the following main steps:
a. Sort component indices from the least reliable to the $N^{th}$ least reliable bit.
b. Determine the enumeration complexity and the ordering of hypotheses to evaluate.
c. Start flipping hypotheses' bits. For every hypothesis, perform hard decoding (if t<4 then hard decoding can be efficiently implemented, at low complexity, and without a Chien search).
d. For every hypothesis with a valid solution (missCorrection=0), compute the sum-LLR of all inverted bits.

e. Save the valid hypothesis with the lowest sum-LLR (or the CL list with the lowest sum-LLRs). Typically, two outputs are generated, the sum-LLR of most likely solution, and the Diff-Sum-LLR which is the difference between the most likely solution and the next most likely solution.

The sum-LLR of the most likely solution is defined as $$S_{ML,1} = \sum_{b_m \in Solution\ 1} |LLR(b_m)|$$

a. where Solution1 is the group of bits, which are suspected as the errors in the currently solved component code. The second best solution yield the following score
b.

$$S_{ML,2} = \sum_{b_m \in Solution\ 2} |LLR(b_m)|$$

c. and Solution2 is the group of bits, which belong to the second best candidate solution, and are also suspected as errors in the currently solved component code. The difference between $S_{ML,1}$ and $S_{ML,2}$ gives a certainty measure for the most likely solution candidate. The Diff-Sum-LLR is defined as $$DS_{ML} = S_{ML,2} - S_{ML,1} \qquad \qquad d.$$

Detailed Description of Multi-Dimensional Soft Decoding

Figure 8:
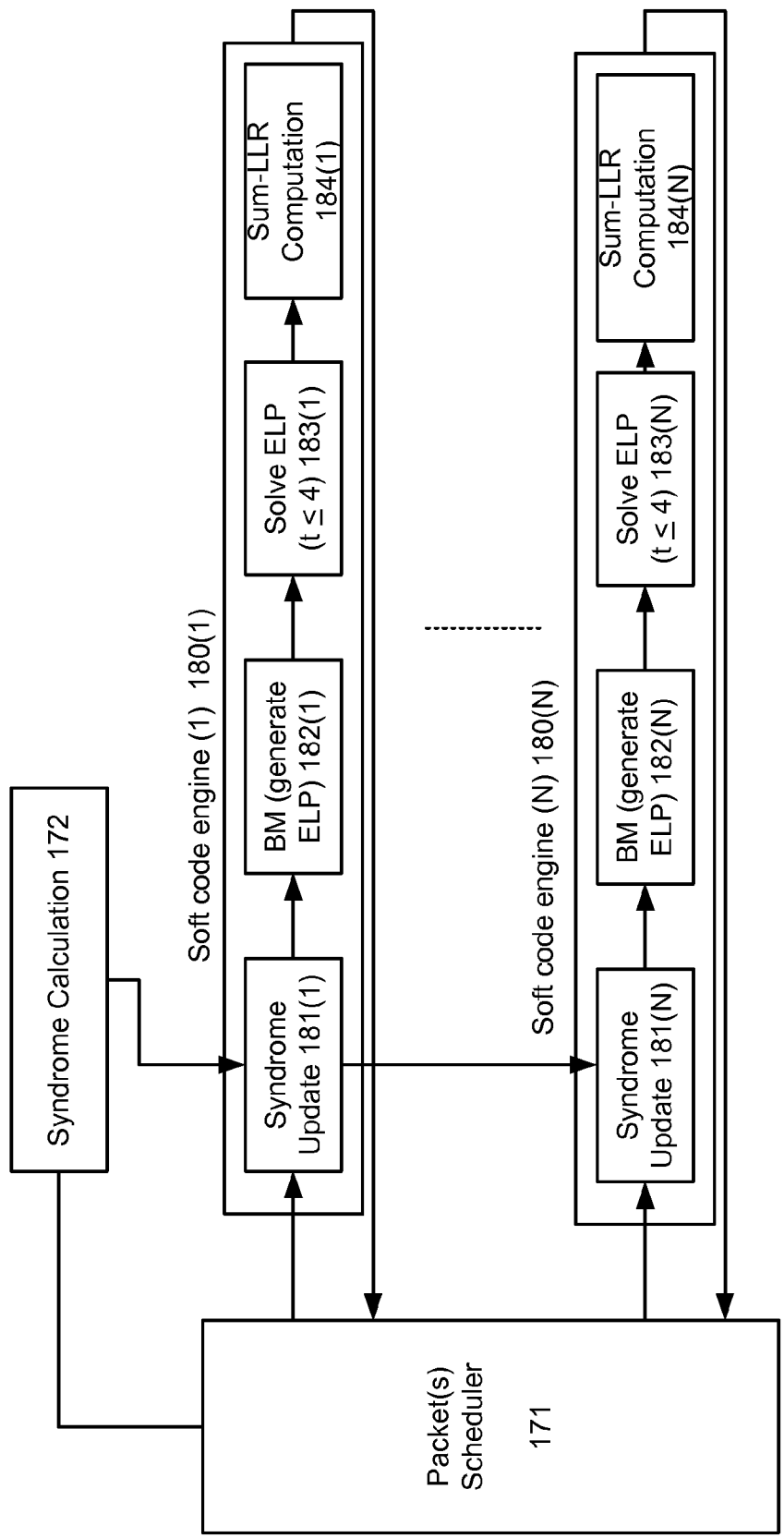
FIG. 8 illustrates a portion of a system according to an embodiment of the invention.

According to an embodiment of this invention, an efficient implementation for a soft decoding of BCH component codes can be employed like illustrated in FIG. 8. A packet(s) scheduler 171 is coupled to syndrome calculator 172 and to multiple (N) soft code engines 180(1)-180(N), each soft code engine (also referred to as component decoder engines) includes a syndrome update circuit (such as 181(1)-181(N)), a BM (for generating ELP) (such as 182(1)-181(N)), a solve ELP circuit (183(1)-183(N)) and a sum LLR computation circuit (184(1)-184(N)). For efficient enumeration on multiple hypotheses a hardware implementation may include several component decoder engines, where every engine decodes the same component code with a different correction hypothesis. Alternatively every engine may decode a different BCH component code of the same dimension. Every decoding engine includes a syndrome update module, which is performed according to the error hypothesis, then for codes with t<4 the error locating polynomial (ELP) may be efficiently generated, and the ELP may also be efficiently solved [C. Chen, "Formulas for the Solutions of Quadratic Equations over GF($2^m$)", *IEEE Trans. On Information Theory*, vol. 28, no. 5, 1982]. In case the decoding result is missCorrection=0 for a certain hypothesis, the sum-LLR of the error bits is computed, and a decision on whether or not to apply the correction is made by the decoder. Conditions for applying the soft suggested corrections are disclosed here.

Since there is an LLR value per bit, the metric of the corrected codeword can be approximated by the sum of LLRs of the corrected bits. In case the sum-LLR, denoted by $S_{ML,1}$, is greater than some threshold, it can be suspected to be a false correction, and thus be rejected.

This property is used in the iterative soft decoding process, to minimize the false correction probability at the expense of higher latency decoding (by multiple iterations). The threshold on the sum-LLR, $S_{ML,1}$, is denoted by $TH_{ML}(iter,dim)$, can be gradually increased every iteration, to allow more and more corrections to be applied, while minimizing false corrections.

Similarly, the Diff-Sum-LLR $DS_{ML}$ can be used for accepting suggested solutions. That is, only suspected errors that produce a sufficiently large $DS_{ML}$ can be accepted. The larger the threshold $DTH_{ML}(iter,dim)$ is, the higher is the confidence in the suggested solution.

According to another embodiment of this invention, the soft decoding per component may begin with stronger packets for several iterations, and proceed with weaker component codes decoding afterwards. Stronger component-codes are component codes, which were encoded at lower code rate according to embodiments of this invention.

According to another embodiment of this invention, changing of LLR values, of stronger component-codes, for soft decoding of component codes for which sum-LLR and diff-Sum-LLR meet a threshold condition, can be used to reduce false corrections during iterative soft decoding, and increase the convergence time, which reduces overall decoding complexity. By changing of LLR values we mean that the LLR values of the bits of a solved packet may be assigned a different value corresponding to the certainty of the solution. For stronger component-codes the solution is may be highly confident and thus the assigned changing LLR value may be for example the maximal absolute LLR value.

According to another embodiment of this invention, the LLR changing absolute value which is assigned to all bits which belong to a solved packet depends on:

a. Component Code strength, i.e. the lower the rate of the component code, the lower may be the probability of finding a false correction. Therefore, the LLR changing value may be higher.

b. The actual values of sum-LLR, $S_{ML,1}$, and Diff-Sum-LLR, $DS_{ML}$, may reflect the certainty of the suggested solution. The lower $S_{ML,1}$, and the higher $DS_{ML}$, the lower may be the probability of finding a false correction. Therefore, the LLR changing value may be higher.

According to another embodiment of the invention, the soft decoder begins by iteratively decoding the stronger component codes. The decoder may adaptively add more and more component codes per dimension to be decoded with the soft decoder, depending on the number of solved packets. The more strong solved component codes available, the higher the probability that weaker components can be solved, and therefore, the decoder may add more and more weaker codes according to progress in solving the stronger packets.

According to another embodiment of this invention, the sum-LLR threshold $TH_{ML}(iter,dim)$ and the diff-Sum-LLR threshold $DT_{HL}(iter,dim)$ can be set per code rate. That is, adapt the thresholds according to the code strength, determined for example by the code rate, which gives thresholds $TH_{ML}(iter, dim, R_C)$, and $DTH_{ML}(iter, dim, R_C)$, where iter is the current iteration index, and dim is a dimension index, and $R_C$ is the component code rate. In summary, a suggested solution may be accepted if $$S_{ML,1} < TH_{ML}(iter,dim,R_C) \text{ and } DS_{ML} > DTH_{ML}(iter, dim,R_C)$$

The following table demonstrates the thresholds selection w.r.t. decoding stage and component code rate

TABLE 1

|  | Dim = 1 | | | Dim = 2 | | |
| --- | --- | --- | --- | --- | --- | --- |
|  | Rc = 0.85 | Rc = 0.9 | Rc = 0.95 | Rc = 0.85 | Rc = 0.9 | Rc = 0.95 |
| $TH_{ML}$ Iteration | | | | | | |
| 1) | 8 | 7 | 6 | 7 | 6 | 5 |
| 2) | 10 | 8 | 7 | 8 | 7 | 6 |
| 3) | 12 | 10 | 9 | 11 | 9 | 8 |
| ... | ... | ... | ... | ... | ... | ... |
| $DTH_{ML}$ Iteration | | | | | | |
| 1) | 3 | 4 | 6 | 3 | 4 | 7 |
| 2) | 2 | 4 | 5 | 2 | 4 | 6 |
| 3) | 2 | 3 | 3 | 2 | 3 | 4 |
| ... | ... | ... | ... | ... | ... | ... |

According to another embodiment of the invention, the enumeration list size is set per component code according to the code rate Rc and current iteration index, and dim is a dimension index, i.e. the list size for enumeration is denoted by L(iter, dim, $R_C$)

According to another embodiment of the invention, an early termination threshold can be used for the enumeration during soft decoding per component code. When the sum-LLR $S_{ML,1}$, and the diff-sum-LLR $DS_{ML}$, meet some conditions the enumeration may terminate. This can reduce the decoding complexity. The early termination thresholds can be set according to $TH_{early}$(iter, dim, $R_C$), and $DTH_{early}$(iter, dim, $R_C$), where iter is the current iteration index, and dim is a dimension index, and $R_C$ is the component code rate. In summary, a suggested solution may be accepted, and enumeration may be terminated before reaching maximal list size if $S_{ML,1} < TH_{early}$(iter,dim,$R_C$) and $DS_{ML} > DTH_{early}$(iter, dim,$R_C$)

Figure 9:
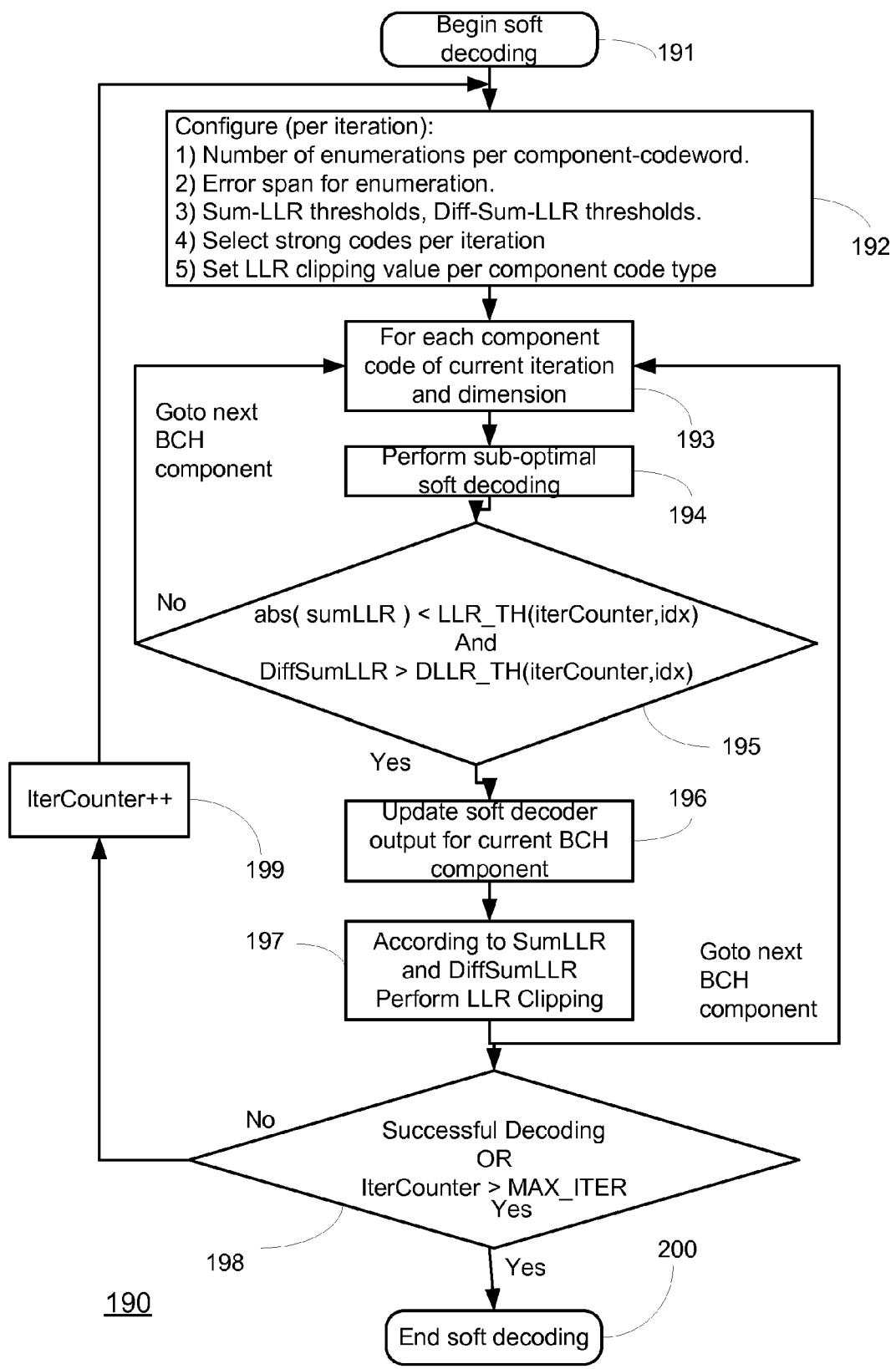
FIG. 9 illustrates a method, according to an embodiment of the invention.

FIG. 9 exemplifies a possible soft decoding flow according to some embodiments of this invention. The flow describes the basic concepts of the soft decoding according to some embodiments of this invention. The soft decoding may begin by configuration of the parameters for component code to be processed in the upcoming iteration. This includes setting the maximal number of enumerations per component code decoding, setting the error span, which specifies the maximal number of bit indices to take part in the enumeration. Error span is the list of indices, which are most likely to be erroneous. The thresholds $TH_{early}$(iter, dim, $R_C$) and $DTH_{early}$(iter, dim, $R_C$), as well as $TH_{ML}$(iter, dim, $R_C$) and $DTH_{ML}$(iter, dim, $R_C$). In addition, the component codes to be decoded in current iteration are selected, basically according to their coding strength and iteration number. In addition the LLR changing value per code rate is selected and set. After the initial configuration the decoding per component code begins, according to the description in the overview of this section. This includes soft decoding with list enumeration on likely errors per component code, and using the code to evaluate error hypotheses. This block is the "sub-optimal soft decoding" in FIG. 9. The sub-optimality naturally lies in the limited list size determined by the maximal enumeration configuration, as performing a full enumeration to achieve maximum-likelihood decoding can have a prohibitively high computational complexity. The resulting sum-LLR and diff-sum-LLR are compared with the relevant thresholds. If conditions are met then solution is accepted, and the error bits hypotheses are corrected in the original codeword. If changing conditions are met, the LLR absolute values associated with the bits in the processed component-code can be assigned the changing value set w.r.t. the code strength iteration count, and dimension. The next step in processing is to decode the next BCH component, until all selected components of current iteration are processed. Then, if decoding is successful, the decoder terminates; otherwise, continue to next iteration, where the first step on next iteration is to configure the parameters of the decoder: thresholds, component codes to process, etc.

Method 190 starts by stage 191 of beginning soft decoding.

Stage 191 is followed by stage 192 of configuring (per iteration), where the configuration here refers to the decoding strategy parameters of current decoding iteration:

a. Number of enumerations per component-codeword.

b. Error span for enumeration.

c. Sum-LLR thresholds, Diff-Sum-LLR thresholds, which are thresholds for the approximated probability measures reflecting the correctness probability of the suggested solution and its significance with respect to the second best suggested solution, respectively.

d. Select strong codes per iteration e. Set LLR clipping value per component code type Stage 192 is followed by control stage 193 that executes sequence 194-197 for each component code of current iteration and dimension.

Stage 193 is followed by stage 194 of performing soft decoding, which is the iterative soft decoding per component code according to embodiments of this invention.

Stage 194 is followed by stage 195 of checking if abs(sumLLR)<LLR_TH(iterCounter,idx) And DiffSumLLR>DLLR_TH(iterCounter,idx), where LLR_TH and DLLRTH are thresholds which correspond to the iteration number and the component code index, as the component codes may have different rates. These thresholds are used for the approximated probability measures reflecting the correctness probability of the suggested solution and its significance with respect to the second best suggested solution, respectively, for decoding of a single component code.

If yes—jumping to stage 196 of updating a soft decoder output for current BCH component.

If no—jumping to stage 192.

Stage 196 is followed by stage 197 of selectively, according to SumLLR and DiffSumLLR, that is, if the conditions 195 are met, the suggested solution of the soft component code decoder is accepted, and its recommended corrections are applied.

Stage 197 is followed by stage 198 of checking whether or not to perform LLR clipping, which means modifying the LLR values of a component code to a new value depending on the code rate and the iteration count. The clipping is done according to iteration predefined configuration, i.e. for some iterations the decoder may disable new clipping operations, while applying clipping during first few iterations.

Stage 198 is followed by stage 199 of checking if there was a Successful Decoding OR IterCounter>MAX_ITER.

If yes—jumping to stage 200 of ending the soft decoding.

If no—jumping to stage 199 of increasing IterCounter–IterCounter++. Stage 199 is followed by stage 192.

Figure 10:
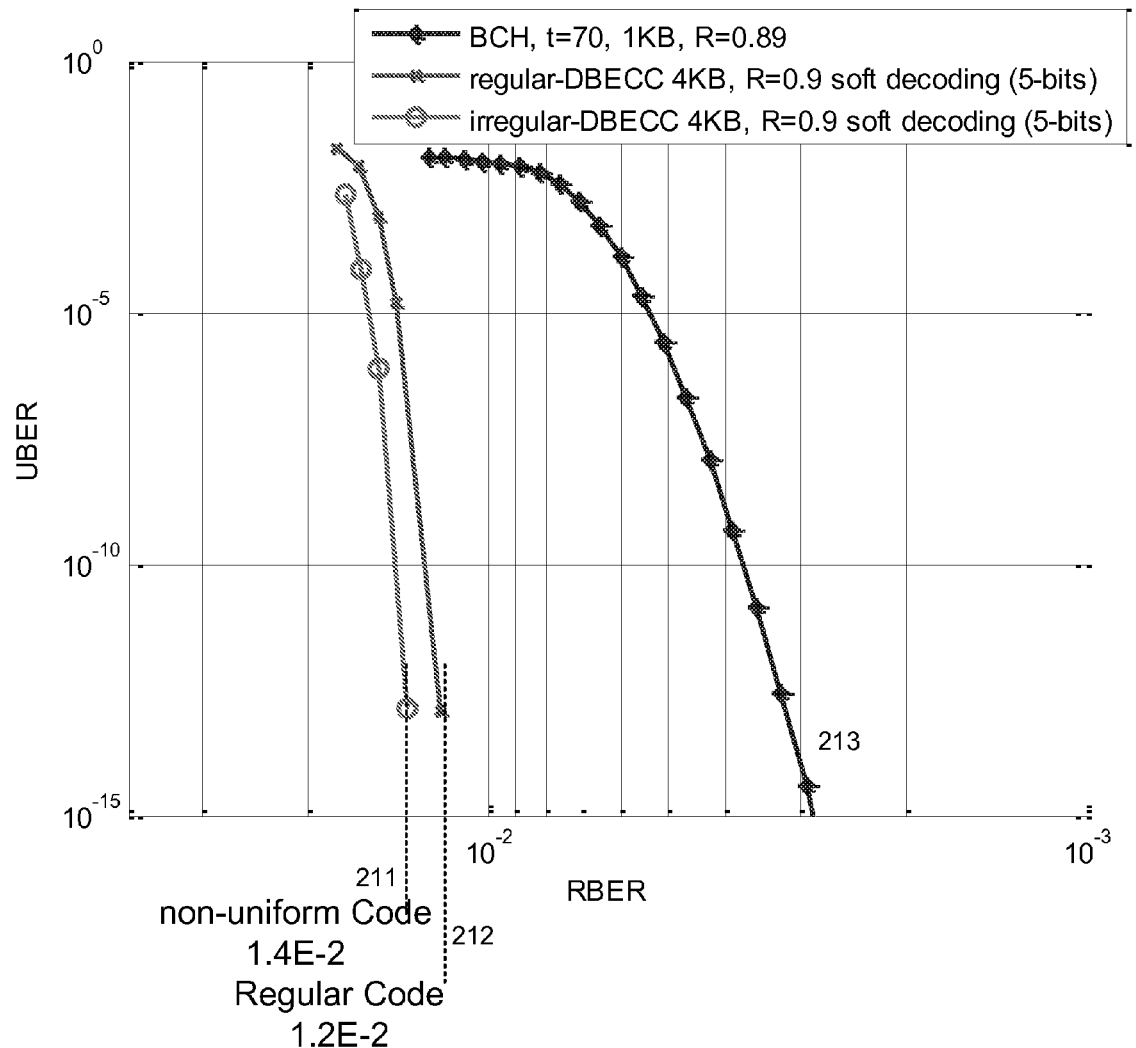
FIG. 10 illustrates the performance of various schemes according to an embodiment of the invention.

FIG. 10 provides an exemplary reliability curve of undecodable bit error rate (UBER) versus the input raw bit error rate (RBER) for a standard BCH code (curve 213), a regular folded BCH code (curve 212) and an non-uniform folded BCH code (curve 211) according to this invention. The input to the decoders is soft input. The standard BCH code is decoded with hard decoding only, since its soft decoding complexity is too high, while the regular folded BCH code and the non-uniform folded BCH code according to embodiments of this invention, perform soft decoding according to embodiments of this invention. As may be noticed the non-uniform code achieves higher error correction capabilities. While a regular folded code can reliability correct input RBER<1.2E-2, the non-uniform folded BCH code corrects RBER<1.4E-2. The code rates here are R=0.9 for all codes, and the payload size is K=4 KB.

FIG. 11 illustrates method 300 according to an embodiment of the invention.

System 300 starts by stage 310 of receiving or generating a multiple dimensional encoded data unit. The multiple dimensional data unit may be noise—it may include errors.

Stage 310 is followed by stage 320 of decoding by a processor the multiple dimensional encoded data unit to provide a decoded data unit. The multiple dimensional encoded data unit comprises multiple component codes associated with multiple dimensions. The multiple dimensions comprise a plurality of non-uniform dimensions. At least two component codes of each non-uniform dimension differ from each other by encoding rate. The decoding is responsive to encoding rates of component codes of the plurality of non-uniform dimensions.

The majority of dimensions of the multiple dimensions may be non-uniform dimensions. A minority of the dimensions can be non-uniform dimensions. All of the multiple dimensions may be non-uniform dimensions.

At least one non-uniform dimension may include a pair of component codes of different size that are associated with a same number of redundancy bits and comprises another pair of component code of a same size that are associated with different numbers of redundancy bits.

The multiple dimensional encoded data unit may include a plurality of folded component codes. The multiple dimensional encoded data unit may include component codes with minimal amount of intersection bits.

The multiple dimensional encoded data unit may include a plurality of component codes and the encoding rates of at least some of the component codes are determined in response to expected reliabilities of the folded component codes.

The component codes of the plurality of non-uniform rates may be encoded using a set of encoding rates that comprises a first encoding rate and a second encoding rate that is higher than the first encoding rate. In this case stage 320 may include at least one of the following:

a. Performing a first decoding process of decoding only component codes encoded with the first encoding rate.
b. Performing, in response to the first decoding results, a second decoding process of the other component code encoded with the second encoding rate.
c. Performing of the first decoding process by decoding only component codes encoded with the first encoding rate and belonging to a certain non-uniform dimension out of the plurality of non-uniform dimensions to provide the first decoding results—e.g. FIG. 7 153, or FIG. 9, 193.
d. Performing of the second decoding process by decoding only component codes encoded with the second encoding rate and belonging to another non-uniform dimension out of the plurality of non-uniform dimensions.
e. Assigning higher reliability to a result of a decoding of component code of lower encoding rates than to a result of a decoding of component code of higher encoding rates, see FIG. 9, 192, step 5).
f. Assigning expected reliabilities to component codes. Expected reliabilities of the component codes may be responsive to reliabilities of flash memory cells that are expected to store the component codes. Expected reliabilities of the component codes are responsive to reliabilities of flash memory cells that are expected to store the component codes. Expected reliabilities of the component codes are responsive to reliabilities of flash memory cells that are expected to store the component codes.
g. Performing multiple iterations of decoding component code of the multiple dimensions e.g. FIG. 7, 199 (iteration count flow).
h. Determining reliability levels to be assigned to results of one iteration of decoding component code of the multiple dimensions based upon results of a previous iteration of decoding component code of the multiple dimensions.
i. Performing a first decoding process of decoding only component codes encoded with the first encoding rate; and performing, in response to the first decoding results, a second decoding process of the other component code encoded with the second encoding rate. Wherein the component codes of the plurality of non-uniform rates are encoded using a set of encoding rates that comprises a first encoding rate and a second encoding rate that is higher than the first encoding rate;
j. Decoding only component codes encoded with the first encoding rate and belonging to a certain non-uniform dimension out of the plurality of non-uniform dimensions to provide the first decoding results—e.g. FIG. 7 153, or FIG. 9, 193.
k. Performing the second decoding process by decoding only component codes encoded with the second encoding rate and belonging to another non-uniform dimension out of the plurality of non-uniform dimensions.
l. Performing the second decoding process while assigning the suggested values to bits that belong to both component codes encoded with the first encoding rate and to component codes encoded with the second encoding rate. Wherein the first decoding results are indicative of suggested values of component codes encoded with the first encoding rate.
m. Performing the second decoding process to provide second suggested values of component codes encoded with the second component codes and invalidating second suggested decoding results due to suggested correction to bits that belong to both component codes encoded with the first encoding rate and to component codes encoded with the second encoding rate that differ from first suggested values of component codes. Wherein the first decoding results are indicative of first suggested values of component codes encoded with the first encoding rate—e.g. FIG. 7 156 (forced components unchanged).
n. Initializing the second decoding process with the first decoding results.
o. Performing the second decoding process to provide second suggested values of component codes encoded with the second component codes and reducing a reliability of second suggested values to bits that belong to both component codes encoded with the first encoding rate and to component codes encoded with the second encoding rate that differ from first suggested values of component codes. Wherein the first decoding results are indicative of first suggested values of component codes encoded with the first encoding rate.

p. Performing initial decoding iterations to provide unsolved intersection bits, wherein the unsolved intersection bits belong to sets of component codes that were not successfully decoded during the initial decoding iterations, wherein the component codes of each set differ from each other by dimension.
q. Decoding the sets of component codes, starting from sets of component codes of lower set encoding rates, wherein a set encoding rate is a function of encoding rates of component codes that belong to the set.
r. Determining to perform decoding of the sets of component codes, starting from sets of component codes of lower set encoding rates, in response to a failure to decode the unsolved intersection bits.
s. Changing a value of an unsolved intersection bit to a modified value to provide modified component codes of a modified set of components; decoding at least one modified component code of the modified set of components to provide a new decoding result
t. Changing values of multiple unsolved intersection bits to modified values to provide modified component codes of modified sets of components; and decoding the multiple modified sets of component codes to provide a new decoding result.
u. Determining whether to modify a reliability value assigned to the unsolved intersection bit in response to the new decoding result.
v. Determining whether to modify the unsolved intersection bit in response to the new decoding result.
w. Performing a first decoding process of decoding only component codes associated with a higher expected reliability.
x. Performing, in response to the first decoding results, a second decoding process of the other component code having a lower expected reliability.
y. Assigning higher reliability to a result of a decoding of component code of lower encoding rates than to a result of a decoding of component code of higher encoding rates.
z. Decoding a single component code by suggesting different hypothesis to a value of the component code; decoding each of the different hypotheses to provide different decoding results; selecting up to one selected hypothesis out of the different hypothesis in response to the different decoding results.
aa. Selecting a selected hypothesis that is associated with a most reliable decoding result of the different decoding results.
bb. Selecting a selected hypothesis that is associated with a most reliable decoding result of the different decoding results and if the most reliable decoding result differs by at least a predefined amount from a second most reliable decoding result of the different decoding results, e.g. FIG. 9, stage 195, which accepts the most likely solution from 194 upon the conditions set in 194.
cc. Assigning to bits of the component code modified reliability values determined in response to the decoding result of the selected hypothesis.
dd. Assigning to bits of the component code reliability values determined in response to the decoding result of the selected hypothesis and to an encoding rate of the component code.
ee. Selecting a number of the different hypotheses in response to an encoding rate of the component code.
ff. Receiving or generating an expected reliability value for each of the different hypothesis before decoding the different hypotheses; determining a reliability threshold; and initializing a decoding of the different hypotheses starting from lower expected reliability hypothesis and ending with higher expected reliability hypothesis.
gg. Stopping the decoding process of the different hypotheses if a decoding result of another hypothesis reached the reliability threshold.
hh. Performing multiple iterations of decoding component code of the multiple dimensions; wherein a decoding of each component code comprises suggesting different hypotheses to a value of the component code; decoding each of the different hypothesis to provide different decoding results; selecting up to one selected hypothesis out of the different hypothesis in response to the different decoding results.
ii. Starting with a decoding of component codes of lower encoding rates and then continuing to decoding of component codes that further comprises component codes of higher encoding rates in following iterations.
jj. Performing for each dimension the following: starting with a decoding of component codes of lower encoding rates and then continuing to decoding of component codes that further comprises component codes of higher encoding rates in following iterations.
kk. Increasing a number of component codes to be decoded during each iteration.
ll. Determining a size of increment of the number of component codes in response to an outcome of at least one completed iteration.
mm. Changing a selection criterion during the multiple iterations. Wherein the selection of up to one selected hypothesis of each component code is based upon the selection criterion.
nn. Changing the selection criterion in response to an encoding rate of a component code associated with the selection criterion.
oo. Changing of the selection criterion in response to an outcome of at least one iteration of the decoding.
pp. Starting with a decoding of component codes of lower expected reliability and then continuing to decoding of component codes that further comprises component codes of higher expected reliability.
qq. Assigning the expected reliabilities of the component codes in response to reliabilities of flash memory cells that are expected to store the component codes.

The first decoding results may be indicative of suggested values of component codes encoded with the first encoding rate. Stage 320 may include performing the second decoding process while assigning the suggested values to bits that belong to both component codes encoded with the first encoding rate and to component codes encoded with the second encoding rate. Stage 320 may include initializing the second decoding process with the first decoding results.

According to an embodiment of the invention stage 320 may include performing initial decoding iterations to provide unsolved non-uniform intersection bits, wherein the initial decoding iterations failed to successfully decode each of the unsolved intersection bits; wherein the unsolved intersection bits belong to pairs of component codes that differ from each other by encoding rates and by dimensions; and decoding the pairs of component codes, starting from a lower encoding rate component code of each pair of component codes.

Stage 320 may include initializing a decoding of a higher encoding rate component code of each pair with a results of the decoding the lower encoding rate component code of each pair.

According to an embodiment of the invention the decoding may include selecting candidates (see, for example stage 194-196) for soft multi-dimensional decoding of multiple component codes to provide selected candidates by performing multiple iterations of a process that includes: calculating reliability information associated with a current set of candidates; wherein each candidate represents an estimated value of bits of the decoded data unit; selecting out of the set of candidates a next set of candidates in response to the reliability information associated to the current set of candidates and candidate number constraint; and defining the next set of candidates as the current set of candidates.

FIG. 12 illustrates method 400 according to an embodiment of the invention.

Method 400 starts by stage 410 of receiving or generating a data unit.

Stage 410 is followed by stage 420 of encoding by a processor the data unit to provide multiple dimensional encoded data unit; wherein the multiple dimensional encoded data unit comprises multiple component codes associated with multiple dimensions; wherein the multiple dimensions comprise a plurality of non-uniform dimensions; wherein at least two component codes of each non-uniform dimension differ from each other by encoding rate.

Stage 420 may include determining the different coding rates based on channel information indicative of reliability of different component codes.

FIG. 13 illustrates method 500 according to an embodiment of the invention.

Method 500 starts by stage 510 of receiving or generating a multiple dimensional encoded data unit.

Stage 510 is followed by stage 520 of performing, for each dimension of multiple dimensions associated with the multiple dimensional encoded data unit, multiple decoding attempts of component codes that belong to the dimension and differ from each other by decoding rate.

Stage 520 may include performing initial decoding attempts of only component codes of higher decoding rate than other component codes of the dimension to provide initial decoding attempt results.

Stage 520 may include performing, in response to the initial decoding attempts results, additional decoding attempts.

At least a majority of the multiple decoding attempts involve soft decoding attempts.

According to an embodiment of the invention the multiple decoding attempts are soft decoding attempts and stage 520 may include altering soft decoding parameters (such as values of bits, LLR values) as a function of at least one parameter out of a dimension and a number of attempts.

According to an embodiment of the invention each decoding attempt may include evaluating different candidates for values of bits of the data unit.

Stage 520 may include determining evaluating parameters as a function of at least one parameter out of a dimension and a number of attempts.

Figure 14:
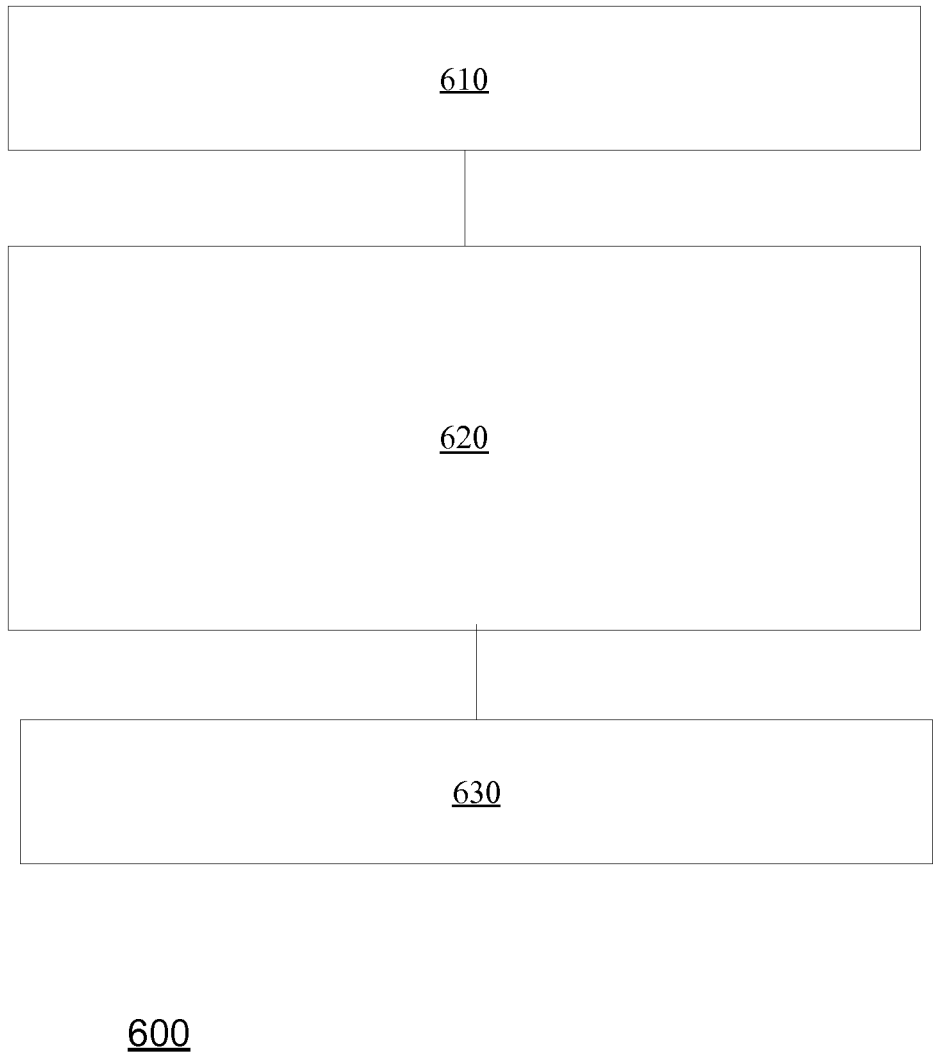
FIG. 14 illustrates a system according to an embodiment of the invention.

FIG. 14 illustrates system 600 according to an embodiment of the invention.

System 600 may include an interface 610 and a processor 620. The interface and the processor may be capable of executing each method of the methods listed in this specification. The processor 620 can be included in a flash memory controller or in a flash memory unit. It can include dedicate encoding and/or decoding circuits. System 600 may include a flash memory unit 630 but may be coupled to the flash memory unit. The processor 620 may be any circuit that is capable of processing data. It may be a general purpose processor, a signal processor, may be a dedicated processor that is designed to be a part of a flash memory controller and the like. The processor 620 may host code of any type that may assist in executing the stages of the methods.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may cause the storage system to allocate disk drives to disk drive groups.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library, and/or other sequence of instructions designed for execution on a computer system.

The computer program may be stored internally on a non-transitory computer readable medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units, or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations, and operations may be executed at least partially overlapping in time. Moreover, alternative embodiments may include multiple instances of a particular operation, and the order of operations may be altered in various other embodiments.

Also, for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations, and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. A method for non-uniform multiple dimensional decoding, the method comprises: reading from a flash memory unit a multiple dimensional encoded data unit; and decoding, by a processor of a flash memory controller that is coupled to the flash memory unit, the multiple dimensional encoded data unit to provide a decoded data unit; wherein the decoding comprise error correction; wherein the multiple dimensional encoded data unit comprises multiple code components associated with multiple dimensions; wherein the multiple dimensions comprise a plurality of non-uniform dimensions; wherein at least two code components of each non-uniform dimension differ from each other by encoding rate; wherein the decoding is responsive to encoding rates of code components of the plurality of non-uniform dimensions; and wherein at least one non-uniform dimension comprises a pair of code components of different size that are associated with a same number of redundancy bits and comprises another pair of component code of a same size that are associated with different numbers of redundancy bits.

2. The method according to claim 1 wherein only a majority of dimensions of the multiple dimensions are non-uniform dimensions.

3. The method according to claim 1 wherein all of the multiple dimensions are non-uniform dimensions.

4. The method according to claim 1 comprising assigning higher reliability to a result of a decoding of component code of lower encoding rates than to a result of a decoding of component code of higher encoding rates.

5. The method according to claim 1 comprising performing multiple iterations of decoding component code of the multiple dimensions.

6. The method according to claim 5 comprising determining reliability levels to be assigned to results of one iteration of decoding component code of the multiple dimensions based upon results of a previous iteration of decoding component code of the multiple dimensions.

7. The method according to claim 1 wherein the multiple dimensional encoded data unit comprises a plurality of folded code components.

8. The method according to claim 7 wherein the multiple dimensional encoded data unit comprises code components that are defined to include a minimal amount of intersection bits out of various amounts of intersection bits obtained when defining the code components in different manners; wherein an intersection bit is a bit of the multiple dimensional encoded data unit that belongs to at least two different code components of at least two different dimensions of the multiple dimensions.

9. The method according to claim 1 wherein the multiple dimensional encoded data unit comprises a plurality of code components wherein encoding rates of at least some of the code components are determined in response to expected reliabilities of the folded code components.

10. The method according to claim 9 wherein the expected reliabilities of the code components are responsive to reliabilities of flash memory cells that are expected to store the code components.

11. The method according to claim 1 wherein only a minority of dimensions of the multiple dimensions are non-uniform dimensions.

12. The method according to claim 1 wherein a decoding of a single component code comprises suggesting different hypothesis to a value of the code component; decoding each of the different hypotheses to provide different decoding results; selecting up to one selected hypothesis out of the different hypothesis in response to the different decoding results.

13. The method according to claim 12 comprising selecting a selected hypothesis that is associated with a most reliable decoding result of the different decoding results.

14. The method according to claim 12 comprising selecting a selected hypothesis that is associated with a most reliable decoding result of the different decoding results when the most reliable decoding result differs by at least a predefined amount from a second most reliable decoding result of the different decoding results.

15. The method according to claim 12 comprising assigning to bits of the component code modified reliability values determined in response to the decoding result of the selected hypothesis.

16. The method according to claim 12 comprising assigning to bits of the component code reliability values determined in response to the decoding result of the selected hypothesis and to an encoding rate of the code component.

17. The method according to claim 12 comprising selecting a number of the different hypotheses in response to an encoding rate of the code component.

18. The method according to claim 12 comprising:
receiving or generating an expected reliability value for each of the different hypothesis before decoding the different hypotheses;
determining a reliability threshold; and
initializing a decoding of the different hypotheses starting from lower expected reliability hypothesis and ending with higher expected reliability hypothesis.

19. The method according to claim 18 further comprising stopping the decoding process of the different hypotheses if a decoding result of another hypothesis reached the reliability threshold.

20. A non-transitory computer readable medium that stores instructions that once executed by a computer causes the computer to: receive or generate a multiple dimensional encoded data unit; and decode the multiple dimensional encoded data unit to provide a decoded data unit; wherein the multiple dimensional encoded data unit comprises multiple code components associated with multiple dimensions; wherein the multiple dimensions comprise a plurality of non-uniform dimensions; wherein at least two code components of each non-uniform dimension differ from each other by encoding rate; wherein the decoding is responsive to encoding rates of code components of the plurality of non-uniform dimensions; wherein at least one non-uniform dimension comprises a pair of code components of different size that are associated with a same number of redundancy bits and comprises another pair of component code of a same size that are associated with different numbers of redundancy bits.

21. The non-transitory computer readable medium according to claim 20 wherein the at least one non-uniform dimension comprises the pair of code components of different size that are associated with the same number of redundancy bits and comprises the other pair of component code of the same size that are associated with different numbers of redundancy bits.

22. The method according to claim 21 wherein at least one non-uniform dimension comprises a pair of code components of different size that are associated with a same number of redundancy bits and comprises another pair of component code of a same size that are associated with different numbers of redundancy bits.

23. The non-transitory computer readable medium according to claim 20 wherein only the majority of dimensions of the multiple dimensions are non-uniform dimensions.

24. The non-transitory computer readable medium according to claim 20 wherein only the minority of dimensions of the multiple dimensions are non-uniform dimensions.

25. The non-transitory computer readable medium according to claim 20 that stores instructions for assigning higher reliability to a result of a decoding of component code of lower encoding rates than to a result of a decoding of component code of higher encoding rates.

26. The non-transitory computer readable medium according to claim 20 wherein the multiple dimensional encoded data unit comprises a plurality of folded code components.

27. The non-transitory computer readable medium according to claim 20 wherein the multiple dimensional encoded data unit comprises code components that are defined to include a minimal amount of intersection bits out of various amounts of intersection bits obtained when defining the code components in different manners; wherein an intersection bit is a bit of the multiple dimensional encoded data unit that belongs to at least two different code components of at least two different dimensions of the multiple dimensions.

28. The non-transitory computer readable medium according to claim 20 wherein the multiple dimensional encoded data unit comprises a plurality of code components wherein encoding rates of at least some of the code components are determined in response to expected reliabilities of the code components.

29. The non-transitory computer readable medium according to claim 28 wherein the expected reliabilities of the code components are responsive to reliabilities of flash memory cells that are expected to store the code components.

30. The non-transitory computer readable medium according to claim 20 wherein a decoding of a single component code comprises suggesting different hypothesis to a value of the code component; decoding each of the different hypotheses to provide different decoding results; selecting up to one selected hypothesis out of the different hypothesis in response to the different decoding results.

31. The non-transitory computer readable medium according to claim 30 comprising selecting a selected hypothesis that is associated with a most reliable decoding result of the different decoding results when the most reliable decoding result differs by at least a predefined amount from a second most reliable decoding result of the different decoding results.

32. A method for non-uniform multiple dimensional decoding, the method comprises: receiving from a flash memory unit a multiple dimensional encoded data unit; decoding, by a processor of a flash memory controller that is coupled to the flash memory unit, the multiple dimensional encoded data unit to provide a decoded data unit; wherein the decoding comprise error correction; wherein the multiple dimensional encoded data unit comprises multiple code components associated with multiple dimensions; wherein the multiple dimensions comprise a plurality of non-uniform dimensions; wherein at least two code components of each non-uniform dimension differ from each other by encoding rate; wherein the decoding is responsive to encoding rates of code components of the plurality of non-uniform dimensions; wherein at least one non-uniform dimension comprises a pair of code components of different size that are associated with a same number of redundancy bits and comprises another pair of component code of a same size that are associated with different numbers of redundancy bits.

33. The method according to claim 32, wherein only a minority of the dimensions of the multiple dimensions are non-uniform dimensions.

34. The method according to claim 32, wherein only a majority of the dimensions of the multiple dimensions are non-uniform dimensions.

35. A flash memory controller that comprises a processor and is coupled to a flash memory unit; wherein the flash memory controller is configured to read from the flash memory unit a multiple dimensional encoded data unit; and wherein the processor is configured to decode the multiple dimensional encoded data unit to correct errors in the multiple dimensional encoded data to provide a decoded data unit; wherein the multiple dimensional encoded data unit comprises multiple code components associated with multiple dimensions; wherein the multiple dimensions comprise a plurality of non-uniform dimensions; wherein at least two code components of each non-uniform dimension differ from each other by encoding rate; wherein the decoding is responsive to encoding rates of code components of the plurality of non-uniform dimensions; wherein at least one non-uniform dimension comprises a pair of code components of different size that are associated with a same number of redundancy bits and comprises another pair of component code of a same size that are associated with different numbers of redundancy bits.

36. The flash memory controller according to claim 35 wherein the at least one non-uniform dimension comprises the pair of code components of different size that are associated with the same number of redundancy bits and comprises another pair of component code of the same size that are associated with different numbers of redundancy bits.

37. The flash memory controller according to claim 35 wherein only the majority of dimensions of the multiple dimensions are non-uniform dimensions.

38. The flash memory controller according to claim 35 wherein the at least one non-uniform dimension comprises the pair of code components of different size that are associated with the same number of redundancy bits and comprises the other pair of component code of the same size that are associated with different numbers of redundancy bits.

39. The flash memory controller according to claim 35 that is configured to assign higher reliability to a result of a decoding of component code of lower encoding rates than to a result of a decoding of component code of higher encoding rates.

40. flash memory controller according to claim 35 wherein the multiple dimensional encoded data unit comprises a plurality of folded code components.

41. flash memory controller according to claim 35 wherein the multiple dimensional encoded data unit comprises code components that are defined to include a minimal amount of intersection bits out of various amounts of intersection bits obtained when defining the code components in different manners; wherein an intersection bit is a bit of the multiple dimensional encoded data unit that belongs to at least two different code components of at least two different dimensions of the multiple dimensions.

42. flash memory controller according to claim 35 wherein the multiple dimensional encoded data unit comprises a plurality of code components wherein encoding rates of at least some of the code components are determined in response to expected reliabilities of the code components.

43. flash memory controller according to claim 42 wherein the expected reliabilities of the code components are responsive to reliabilities of flash memory cells that are expected to store the code components.

44. flash memory controller according to claim 35 wherein a decoding of a single component code comprises suggesting different hypothesis to a value of the code component; decoding each of the different hypotheses to provide different decoding results; selecting up to one selected hypothesis out of the different hypothesis in response to the different decoding results.

45. flash memory controller according to claim 44 comprising selecting a selected hypothesis that is associated with a most reliable decoding result of the different decoding results when the most reliable decoding result differs by at least a predefined amount from a second most reliable decoding result of the different decoding results.

* * * * *